(12) United States Patent
Futase

(10) Patent No.: US 7,994,049 B2
(45) Date of Patent: Aug. 9, 2011

(54) MANUFACTURING METHOD OF SEMICONDUCTOR DEVICE INCLUDING FILLING A CONNECTING HOLE WITH METAL FILM

(75) Inventor: Takuya Futase, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 357 days.

(21) Appl. No.: 12/132,682

(22) Filed: Jun. 4, 2008

(65) Prior Publication Data

US 2008/0311718 A1  Dec. 18, 2008

(30) Foreign Application Priority Data

Jun. 15, 2007  (JP) .................................. 2007-158238

(51) Int. Cl.
*H01L 21/4763* (2006.01)
(52) U.S. Cl. ........ 438/629; 438/296; 438/586; 438/597; 438/598; 257/E21.17
(58) Field of Classification Search .................. 438/296, 438/586, 597, 598, 629
See application file for complete search history.

(56) References Cited

U.S. PATENT DOCUMENTS

| | | | |
|---|---|---|---|
| 4,821,085 A * | 4/1989 | Haken et al. .................. 257/412 |
| 5,084,417 A * | 1/1992 | Joshi et al. ..................... 438/653 |
| 5,302,539 A * | 4/1994 | Haken et al. .................. 438/228 |
| 5,567,483 A * | 10/1996 | Foster et al. .................. 427/535 |
| 5,593,511 A * | 1/1997 | Foster et al. .................. 148/238 |
| 5,652,181 A * | 7/1997 | Thakur .......................... 438/385 |
| 5,989,652 A * | 11/1999 | Ameen et al. ................. 427/534 |
| 6,114,736 A * | 9/2000 | Balasubramanyam et al. ............................. 257/412 |
| 6,159,839 A * | 12/2000 | Jeng et al. ..................... 438/618 |
| 6,171,717 B1 * | 1/2001 | Chang et al. .................. 428/698 |
| 6,174,803 B1 * | 1/2001 | Harvey .......................... 438/638 |
| 6,215,144 B1 * | 4/2001 | Saito et al. .................... 257/310 |
| 6,235,632 B1 * | 5/2001 | Nogami et al. ............... 438/675 |
| 6,274,496 B1 * | 8/2001 | Leusink et al. ............... 438/685 |
| 6,403,478 B1 * | 6/2002 | Seet et al. ..................... 438/672 |
| 6,432,479 B2 * | 8/2002 | Chang et al. ........... 427/255.394 |

(Continued)

FOREIGN PATENT DOCUMENTS

JP   2004-363402 A   12/2004

(Continued)

*Primary Examiner* — Thao X Le
*Assistant Examiner* — Eric W Jones
(74) *Attorney, Agent, or Firm* — Miles & Stockbridge P.C.

(57) ABSTRACT

The present invention is to possible to avoid an inconvenience at a coupling portion between a barrier metal film obtained by depositing a titanium nitride film on a titanium film and thus having a film stack structure and a metal film filled, via the barrier metal film, in a connecting hole opened in an insulating film. The manufacturing method of a semiconductor device includes the steps of: forming a contact hole and exposing a nickel silicide layer from the bottom of the contact hole; forming a thermal reaction Ti film by a thermal reaction using a $TiCl_4$ gas, forming a plasma reaction Ti film by a plasma reaction using a $TiCl_4$ gas, carrying out plasma treatment with an $H_2$ gas to decrease the chlorine concentration of the plasma reaction Ti film and at the same time to reduce an oxide film on the surface of the nickel silicide layer; forming a nitrogen-rich TiN film over the surface of the plasma reaction Ti film and at the same time reducing the oxide film on the surface of the nickel silicide layer by thermal nitridation treatment with an $NH_3$ gas and plasma treatment with an $NH_3$ gas.

41 Claims, 29 Drawing Sheets

U.S. PATENT DOCUMENTS

| | | | |
|---|---|---|---|
| 6,468,857 B2* | 10/2002 | Igarashi et al. | 438/241 |
| 6,476,488 B1* | 11/2002 | Jeng et al. | 257/751 |
| 6,479,873 B1* | 11/2002 | Yoshiyama et al. | 257/382 |
| 6,635,569 B1* | 10/2003 | Ameen et al. | 438/680 |
| 6,881,614 B2* | 4/2005 | Liaw | 438/161 |
| 7,037,774 B1* | 5/2006 | Syau | 438/230 |
| 7,135,733 B2* | 11/2006 | Downey et al. | 257/306 |
| 7,465,624 B2* | 12/2008 | Nakajima et al. | 438/233 |
| 7,538,397 B2* | 5/2009 | Kotani | 257/380 |
| 7,595,263 B2* | 9/2009 | Chung et al. | 438/633 |
| 2002/0111018 A1* | 8/2002 | Tai | 438/655 |
| 2003/0036263 A1* | 2/2003 | Lin et al. | 438/638 |
| 2003/0124842 A1* | 7/2003 | Hytros et al. | 438/680 |
| 2004/0076068 A1* | 4/2004 | Yamada et al. | 365/232 |
| 2004/0097032 A1* | 5/2004 | Yamanoue et al. | 438/238 |
| 2005/0009325 A1* | 1/2005 | Chung et al. | 438/637 |
| 2005/0031786 A1* | 2/2005 | Lee et al. | 427/255.28 |
| 2005/0221005 A1* | 10/2005 | Wakabayashi et al. | 427/248.1 |
| 2005/0233492 A1* | 10/2005 | Ouellet et al. | 438/50 |
| 2005/0257747 A1* | 11/2005 | Wakabayashi et al. | 118/728 |
| 2006/0001162 A1* | 1/2006 | Schutz et al. | 257/754 |
| 2006/0084247 A1* | 4/2006 | Liu | 438/510 |
| 2006/0105104 A1* | 5/2006 | Tada | 427/248.1 |
| 2006/0110895 A1* | 5/2006 | Ouellet et al. | 438/482 |
| 2006/0163671 A1* | 7/2006 | Gulari et al. | 257/388 |
| 2006/0166403 A1* | 7/2006 | Ouellet et al. | 438/109 |
| 2007/0117382 A1* | 5/2007 | Koo et al. | 438/677 |
| 2007/0161218 A1 | 7/2007 | Ichinose et al. | |
| 2007/0173050 A1 | 7/2007 | Ichinose et al. | |
| 2007/0190780 A1* | 8/2007 | Chung et al. | 438/675 |
| 2007/0238321 A1 | 10/2007 | Futase et al. | |
| 2007/0254446 A1* | 11/2007 | Pellizzer et al. | 438/309 |
| 2007/0269976 A1 | 11/2007 | Futase et al. | |
| 2008/0020535 A1* | 1/2008 | Gulari et al. | 438/299 |
| 2008/0083955 A1* | 4/2008 | Kanarsky et al. | 257/382 |
| 2008/0132061 A1* | 6/2008 | Luoh et al. | 438/653 |
| 2008/0226822 A1* | 9/2008 | Wakabayashi et al. | 427/255.391 |
| 2009/0014879 A1* | 1/2009 | Park et al. | 257/751 |

FOREIGN PATENT DOCUMENTS

| | | |
|---|---|---|
| JP | 2005-79543 A | 3/2005 |
| JP | 2007-311540 A | 5/2006 |
| JP | 2006-179645 A | 7/2006 |
| JP | 2007-214538 A | 8/2007 |
| JP | 2007-194468 A | 10/2007 |
| JP | 2007-281298 A | 10/2007 |

\* cited by examiner

FIG. 11

| STEP | 1 | 2 | 3 | 4 | 5 | 6 | 7 | 8 | 9 | 10 |
|---|---|---|---|---|---|---|---|---|---|---|
| COMMENT | Gas Ramp | Preheat | TiCl4 Diverting | TiCl4 Soaking | Ti Depo. | H2 Plasma | Purge | NH3 Flow | NH3 Plasma | Vacuum |
| Time (sec) | 5 | 21 | 8 | 5~30 | | 5~30 | 5 | 0~75 | 25~75 | 5 |
| Ar (sccm) | 800 | 800 | 800 | 800 | 800 | 800 | 800 | 800 | 800 | 800 |
| H2 (sccm) | 4000 | 4000 | 4000 | 4000 | 4000 | 4000 | 4000 | 4000 | 4000 | 4000 |
| TiCl4 (sccm) | 0 | 0 | 6.7 | 6.7 | 6.7 | 0 | 0 | 0 | 0 | 0 |
| | | | divert chamber | chamber | chamber | | | | | |
| NH3 (sccm) | 0 | 0 | 0 | 0 | 0 | 0 | 0 | 500 | 500 | 0 |
| Press (Pa) | 0→666.6 | 666.6 | 666.6 | 666.6 | 666.6 | 666.6 | 666.6 | 666.6 | 666.6 | 0 |
| RF Power (W) | 0 | 0 | 0 | 0 | 800 | 800 | 0 | 0 | 800 | 0 |

FIG. 14

| STEP | 1 | 2 | 3 | 4 | 5 | 6 | 7 | 8 | 9 | 10 | 11 | 12 | 13 |
|---|---|---|---|---|---|---|---|---|---|---|---|---|---|
| COMMENT | Gas Ramp | Preheat | TiCl4 Diverting | TiCl4 Soaking | Ti Depo. | H2 Plasma | TiCl4 Diverting | Ti Depo. | H2 Plasma | Purge | NH3 Flow | NH3 Plasma | Vacuum |
| Time (sec) | 5 | 21 | 8 | 5~30 | 5 | 5 | 8 | 5 | 5 | 5 | 0~75 | 25~75 | 5 |
| Ar (sccm) | 800 | 800 | 800 | 800 | 800 | 800 | 800 | 800 | 800 | 800 | 800 | 800 | 800 |
| H2 (sccm) | 4000 | 4000 | 4000 | 4000 | 4000 | 4000 | 4000 | 4000 | 4000 | 4000 | 4000 | 4000 | 4000 |
| TiCl4 (sccm) | 0 | 0 | 6.7 | 6.7 | 6.7 | 0 | 6.7 | 6.7 | 0 | 0 | 0 | 0 | 0 |
|  |  |  | divert | chamber | chamber |  | divert | chamber |  |  |  |  |  |
| NH3 (sccm) | 0 | 0 | 0 | 0 | 0 | 0 | 0 | 0 | 0 | 0 | 500 | 500 | 0 |
| Press (Pa) | 0→666.6 | 666.6 | 666.6 | 666.6 | 666.6 | 666.6 | 666.6 | 666.6 | 666.6 | 666.6 | 666.6 | 666.6 | 0 |
| RF Power (W) | 0 | 0 | 0 | 0 | 800 | 800 | 0 | 800 | 800 | 0 | 0 | 800 | 0 |

FIG. 16

| STEP | 1 | 2 | 3 | 4 | 5 | 6 | 7 | 8 | 9 | 10 |
|---|---|---|---|---|---|---|---|---|---|---|
| COMMENT | Gas Ramp | Preheat | TiCl4 Diverting | TiCl4 Soaking | Ti Depo. | H2 Plasma | Purge | NH3 Flow | NH3 Plasma | Vacuum |
| Time (sec) | 5 | 21 | 8 | 5~30 | | 5 | 5 | 10 | 5 | 5 |
| Ar (sccm) | 800 | 800 | 800 | 800 | 800 | 800 | 800 | 800 | 800 | 800 |
| H2 (sccm) | 4000 | 4000 | 4000 | 4000 | 4000 | 4000 | 4000 | 4000 | 4000 | 4000 |
| TiCl4 (sccm) | 0 | 0 | 6.7 | 6.7 | 6.7 | 0 | 0 | 0 | 0 | 0 |
| | | | divert chamber | divert chamber | divert chamber | | | | | |
| NH3 (sccm) | 0 | 0 | 0 | 0 | 0 | 0 | 0 | 500 | 500 | 0 |
| Press (Pa) | 0→666.6 | 666.6 | 666.6 | 666.6 | 666.6 | 666.6 | 666.6 | 666.6 | 666.6 | 0 |
| RF Power (W) | 0 | 0 | 0 | 0 | 800 | 800 | 0 | 0 | 800 | 0 |

| STEP | 11 | 12 | 13 | 14 | 15 | 16 | 17 |
|---|---|---|---|---|---|---|---|
| COMMENT | TiCl4 Diverting | Ti Depo. | H2 Plasma | Purge | NH3 Flow | NH3 Plasma | Vacuum |
| Time (sec) | 8 | | 5 | 5 | 10 | 5 | 5 |
| Ar (sccm) | 800 | 800 | 800 | 800 | 800 | 800 | 800 |
| H2 (sccm) | 4000 | 4000 | 4000 | 4000 | 4000 | 4000 | 4000 |
| TiCl4 (sccm) | 6.7 | 6.7 | 0 | 0 | 0 | 0 | 0 |
| | divert chamber | divert chamber | | | | | |
| NH3 (sccm) | 0 | 0 | 0 | 0 | 500 | 500 | 0 |
| Press (Pa) | 666.6 | 666.6 | 666.6 | 666.6 | 666.6 | 666.6 | 0 |
| RF Power (W) | 0 | 800 | 800 | 0 | 0 | 800 | 0 |

FIG. 19

| STEP | 1 | 2 | 3 | 4 | 5 | 6 | 7 | 8 | 9 | 10 | 11 | 12 |
|---|---|---|---|---|---|---|---|---|---|---|---|---|
| COMMENT | Gas Ramp | Preheat | TiCl4 Diverting | Diverting | Stab | TiCl4 Flow | Depo. | TiCl4 Flow | NH3 Diverting | NH3 Flow | Purge | Vacuum |
| Time (sec) | 5 | 30 | 10 | 4 | 1 | 0.5 | 6 | 2 | 2 | 5 | 10 | 5 |
| TiCl4 (sccm) | 0 | 0 | 60 | 60 | 60 | 60 | 60 | 60 | 0 | 0 | 0 | 0 |
| TiCl4 SYSTEM CARRIER N2 (sccm) | 500 | 500 | 200 | 1800 | 170 | 170 | 170 | 1800 | 1000 | 200 | 1000 | 0 |
| NH3 (sccm) | 60 | 60 | 4500 | 60 | 60 | 60 | 60 | 0 | 1000 | 4500 | 0 | 0 |
| NH3 SYSTEM CARRIER N2 (sccm) | 500 | 500 | 200 | 1800 | 170 | 170 | 170 | | 1000 | 200 | 1000 | 0 |
| | chamber | chamber | chamber | divert | divert | divert | chamber | chamber | divert | chamber | | |
| Press (Pa) | 0→650 | 650 | 260 | 260 | 260 | 260 | 260 | 260 | 260 | 260 | 0 | 0 |

FIG. 21

| STEP | 1 | 2 | 3 | 4 | 5 | 6 |
|---|---|---|---|---|---|---|
| COMMENT | preflow | Nuc. | purge | preflow | viafill | vacuum |
| Time (sec) | 5 | A1 | 15 | 5 | A2 | 3 |
| press (Pa) | 2667 | 2667 | 10666 | 10666 | 10666 | 0 |
| temp. (°C) | 390 | 390 | 390 | 390 | 390 | 390 |
| L01:WF6 (sccm) | 50 | 50 | 0 | 250 | 250 | 0 |
| L03:Ar (sccm) | 4500 | 4500 | 7000 | 4000 | 4000 | 4000 |
| L04:SiH4 (sccm) | 40 | 40 | 0 | 0 | 0 | 0 |
| L05:H2 (sccm) | 900 | 900 | 2200 | 2200 | 2200 | 2200 |
| L06:N2 (sccm) | 1350 | 1350 | 2000 | 200 | 200 | 200 |
| L07:BSAr (sccm) | 1000 | 1000 | 2000 | 2000 | 2000 | 2000 |
| L08:H2 (sccm) | 0 | 0 | 1700 | 1700 | 1700 | 1700 |
| L01:WF6 FLOW MODE | divert | chamber | | divert | | |
| L04:SiH4 FLOW MODE | divert | chamber | | | | |

\* L01 TO L08 EACH REPRESENTS THE NUMBER OF A GAS LINE SYSTEM TO THE CHAMBER.

FIG. 22

| STEP | 1 | 2 | 3 | 4 | 5 | 6 | 7 | 8 | 9 |
|---|---|---|---|---|---|---|---|---|---|
| COMMENT | WF6 flow | purge | SiH4 flow | purge | preflow | passivate | press up | main | vacuum |
| Time (sec) | 1.5 | 1.5 | 1.5 | 1.5 | 3 | 11 | 40 | | 3 |
| press (Pa) | 1000 | 1000 | 1000 | 1000 | 1000 | 1000 | 10666 | 10666 | 0 |
| temp. (°C) | 350 | 350 | 350 | 350 | 350 | 350 | 390 | 390 | 390 |
| L01: WF6 (sccm) | 160 | 0 | 160 | 160 | 60 | 60 | 350 | 350 | 0 |
| L03: Ar (sccm) | 6000 | 6000 | 6000 | 6000 | 6000 | 6000 | 4000 | 4000 | 4000 |
| L04: SiH4 (sccm) | 400 | 400 | 400 | 0 | 0 | 0 | 0 | 0 | 0 |
| L05: H2 (sccm) | 0 | 0 | 0 | 0 | 4000 | 4000 | 4000 | 2200 | 2200 |
| L06: N2 (sccm) | 2000 | 2000 | 2000 | 2000 | 2000 | 2000 | 2000 | 200 | 200 |
| L07: BSAr (sccm) | 2000 | | 1 | 2000 | 2000 | 2000 | 2000 | 2000 | 2000 |
| L08: H2 (sccm) | 0 | 0 | 0 | 0 | 0 | 0 | 0 | 1700 | 1700 |
| L01: WF6 FLOW MODE | chamber | | | divert | divert | chamber | chamber | chamber | |
| L04: SiH4 FLOW MODE | divert | divert | chamber | | | | | | |

\* L01 TO L09 EACH REPRESENTS THE NUMBER OF A GAS LINE SYSTEM TO THE CHAMBER.

FIG. 23

| STEP | 1 | 2 | 3 | 4 | 5 | 6 | 7 | 8 | 9 | 10 |
|---|---|---|---|---|---|---|---|---|---|---|
| COMMENT | WF6 flow | purge | B2H6 flow | purge | stab | preflow | passivate | press up | main | vacuum |
| Time (sec) | 1.5 | 1.5 | 3 | 1.5 | 1.5 | 1.5 | 11 | 40 | | 3 |
| press (Pa) | 1000 | 1000 | 1000 | 1000 | 1000 | 1000 | 1000 | 10666 | 10666 | 0 |
| temp. (°C) | 350 | 350 | 350 | 350 | 350 | 350 | 350 | 390 | 390 | 390 |
| L01: WF6 (sccm) | 160 | 0 | 0 | 160 | 0 | 60 | 60 | 200 | 200 | 0 |
| L03: Ar (sccm) | 6000 | 6000 | 6000 | 6000 | 6000 | 6000 | 6000 | 2000 | 2000 | 2000 |
| L05: H2 (sccm) | 0 | 0 | 0 | 0 | 4000 | 4000 | 4000 | 4000 | 2200 | 2200 |
| L06: N2 (sccm) | 2000 | 2000 | 2000 | 2000 | 2000 | 2000 | 2000 | 2000 | 200 | 200 |
| L07: BSAr (sccm) | 2000 | 1 | 1 | 2000 | 2000 | 2000 | 2000 | 2000 | 2000 | 2000 |
| L08: H2 (sccm) | 0 | 0 | 0 | 0 | 0 | 0 | 0 | 1700 | 1700 | 1700 |
| L09: B2H6 (sccm) | 0 | 1000 | 1000 | 0 | 0 | 0 | 0 | 0 | 0 | 0 |
| L01: WF6 FLOW MODE | chamber | divert | divert | chamber | | divert | chamber | chamber | chamber | |
| L09: B2H6 FLOW MODE | | divert | chamber | | | | | | | |

*L01 TO L09 EACH REPRESENTS THE NUMBER OF A GAS LINE SYSTEM TO THE CHAMBER.

FIG. 24A
FIG. 24B
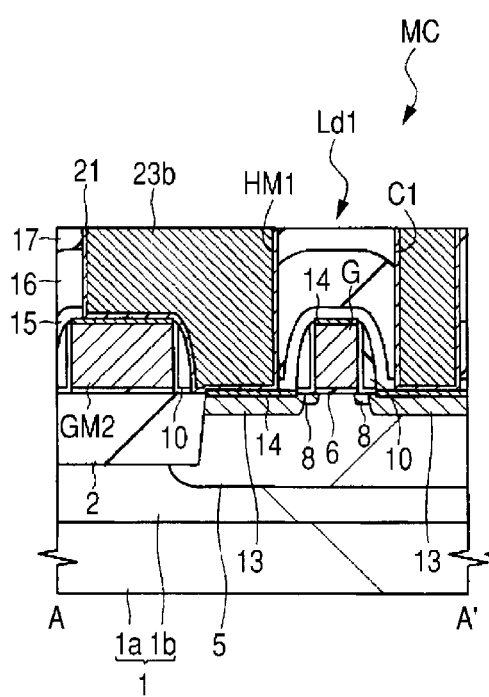
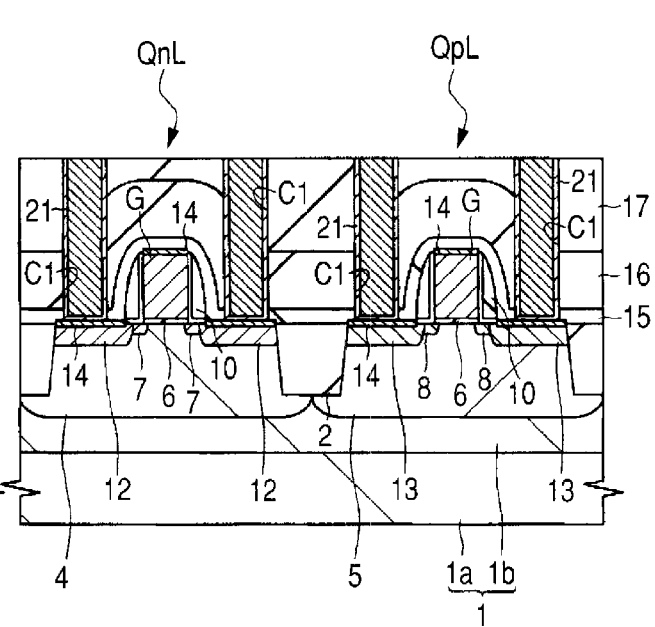

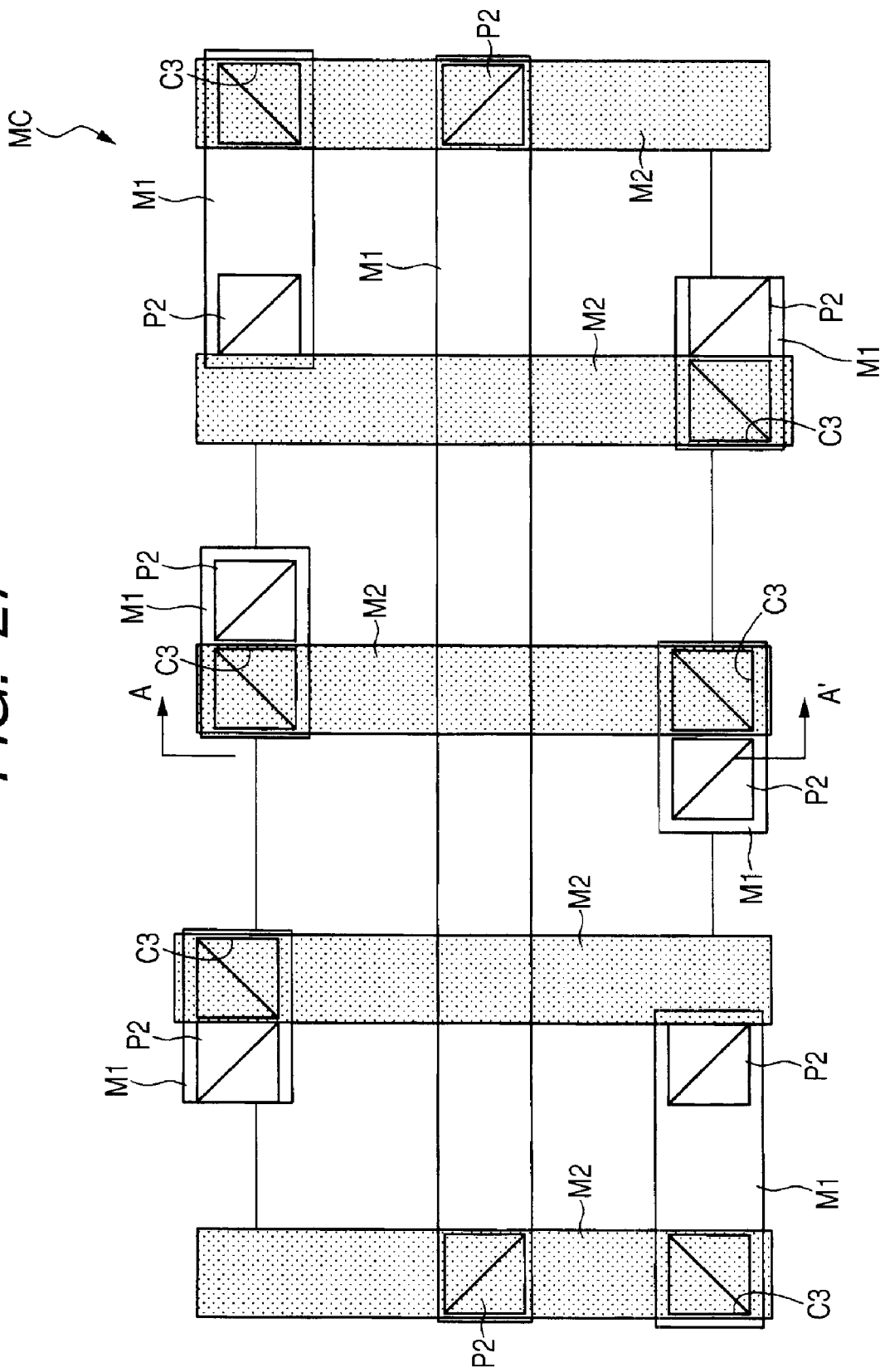

MANUFACTURING METHOD OF SEMICONDUCTOR DEVICE INCLUDING FILLING A CONNECTING HOLE WITH METAL FILM

CROSS-REFERENCE TO RELATED APPLICATIONS

The disclosure of Japanese Patent Application No. 2007-158238 filed on Jun. 15, 2007 including the specification, drawings and abstract is incorporated herein by reference in its entirety.

BACKGROUND OF THE INVENTION

The present invention relates to a manufacturing technology of a semiconductor device, in particular, to a technology effective when applied to a manufacturing step of a semiconductor device for filling a metal film, via a barrier metal film, in a connecting hole opened in an insulating film.

Japanese Patent Laid-Open No. 2004-363402 discloses a method of forming a Ti layer on at least the inner wall and bottom portion of a contact hole penetrating an insulating layer, nitriding the Ti layer with N radicals to form a TiN layer on the Ti layer, and filling a conductive layer in the contact hole (refer to Japanese Patent Laid-Open No. 2004-363402, Paragraphs [0026] to [0028], FIGS. 4 and 5).

Japanese Patent Laid-Open No. 2006-179645 discloses a method of forming a contact hole in an interlayer insulating film, forming a Ti film so as to cover the contact hole therewith, and subjecting the Ti film to plasma nitriding treatment to form a TiN film on the bottom surface of the contact hole (refer to Japanese Patent Laid-Open No. 2006-179645, Paragraphs [0038] to [0040], FIG. 2).

Japanese Patent Laid-Open No. 2005-79543 discloses a method of forming a Ti film over a substrate by CVD, oxidizing the surface of the Ti film, and nitriding the surface of the Ti film to form a TiN film (refer to Japanese Patent Laid-Open No. 2005-79543, Paragraphs [0044] to [0048], FIG. 5).

SUMMARY OF THE INVENTION

In semiconductor devices, a semiconductor substrate and an interconnect are coupled to each other via a plug made of a conductive member, for example, tungsten or copper filled in a connecting hole penetrating an insulating film laid between them. On the surface of the semiconductor substrate contiguous to the bottom portion of the connecting hole, a low-resistance silicide layer permitting the formation of a shallow junction is formed. Among silicide layers, a nickel silicide (NiSi) layer has a resistance as low as from 14 to 20 O/cm and can be formed by the silicide technology at a relatively low temperature, for example, at from 400 to 600° C. so that employment of a nickel silicide layer for semiconductor devices required to be smaller has been examined recently.

It is the common practice to form a barrier metal film, which is obtained by depositing a titanium nitride film on a titanium film and thus has a film stack structure, between a plug filled in a connecting hole and a nickel silicide layer formed over the surface of a semiconductor substrate. The titanium film is used as a reducing material of the surface of the nickel silicide layer because it can contain, in the solid solution thereof, up to 25 at % of an oxygen atom. The titanium film has a function of decreasing a contact resistance with the nickel silicide layer. The titanium nitride film, on the other hand, has a function of suppressing or preventing diffusion of constituent atoms of the plug.

The barrier metal film obtained by depositing a titanium nitride film on a titanium film and thus having a film stack structure has, however, various technological problems as will be described below.

In general, the titanium film is formed by PECVD (Plasma Enhanced Chemical Vapor Deposition) or CVD using a $TiCl_4$ gas and an $H_2$ gas, while the titanium nitride film is formed by CVD using a $TiCl_4$ gas and an $NH_3$ gas. The forming temperature of these films must be set at 550° C. or less in consideration of the heat resistance of the nickel silicide layer. When the titanium film and titanium nitride film are formed at such a low temperature of 550° C. or less, chlorine, that is, a raw material gas, remains in the barrier metal film having the film stack structure and raises the resistivity of the barrier metal film. This results in a rise in contact resistance between the plug and nickel silicide layer. In addition to such a problem, another problem occurs, for example, peeling between the titanium film and titanium nitride film caused by chlorine that has remained in the barrier metal film or microcracks in the titanium nitride film induced by release, to the air, of chlorine remaining in the barrier metal film.

When a tungsten film, which will be a plug, is filled in the connecting hole, the tungsten film is deposited on the titanium nitride film forming the upper portion of the barrier metal film. The tungsten film is formed by CVD while making use of reduction of a $WF_6$ gas with an $H_2$ gas, but fluorine contained in the $WF_6$ gas penetrates even the titanium film via a grain boundary of the titanium nitride film and may cause blister or peeling of the titanium film. The titanium nitride film is formed between the titanium film and tungsten film and penetration of fluorine can be prevented by thickening of the titanium nitride film. Resistance of the barrier metal film however increases with the thickening of the titanium nitride film so that the thickness of it must be made as thin as 10 nm or less. Penetration of fluorine contained in the $WF_6$ gas cannot therefore be prevented easily.

Due to the formation of the barrier metal film, an oxide film is formed on the surface of the nickel silicide layer and there appear some portions which hamper electrical conduction between the titanium film and nickel silicide layer forming the lower portion of the barrier metal film. It has been confirmed by the present inventors that for example in first and second field effect transistors formed adjacent to each other and having a gate electrode made of a polycrystalline silicon film and a nickel silicide layer formed thereover, such electrically nonconductive portions tend to appear at a shared contact which is held in common by a connecting hole formed in contact with the gate electrode of the first field effect transistor and a connecting hole formed in contact with a drain (or source) of the second field effect transistor; and that they frequently occur when the end portions of the nickel silicide layer or polycrystalline silicon film forming the gate electrode of the first field effect transistor are exposed by overetching.

When a plug is formed using copper as a conductive member to be filled in the connecting hole, a seed layer made of copper or ruthenium is formed inside the connecting hole and then a copper film is laid over the seed layer by electroplating to fill the copper film in the connecting hole. Contaminants or the like on the surface of the barrier metal film however prevent formation of a uniform seed layer and complete filling of the connecting hole with the copper film. This may lead to conduction failure of the plug.

The barrier metal film obtained by depositing a titanium nitride film on a titanium film and thus having a film stack structure is formed by successive film formation using a multi-chamber type film forming apparatus in order to provide a good interface condition between the titanium film and titanium nitride film. The formation of the titanium film and titanium nitride film is however accompanied by generation of a relatively large amount of foreign matters compared with the film formation using another semiconductor material. This inevitably requires termination of the operation of the film forming apparatus and chamber cleaning whenever the formation of the titanium film and titanium nitride film over 500 semiconductor wafers is finished. It inhibits achievement of a target operation rate. In addition, when either one of a chamber for forming the titanium film or a chamber for forming the titanium nitride film is terminated, the film forming apparatus must be stopped even if the other chamber can be used. Such termination of the chamber causes a further decrease in the operation rate of the film forming apparatus.

One of the objects of the present invention is to provide a technology capable of avoiding an inconvenience at a coupling portion between a barrier metal film obtained by depositing a titanium nitride film on a titanium film and thus having a film stack structure and a metal film filled, via the barrier metal film, in a connecting hole opened in an insulating film.

Another object of the present invention is to provide a technology capable of improving the operation rate of a multi-chamber type film forming apparatus to be used for the formation of the barrier metal film.

The above-described and other objects and novel features of the present invention will be apparent from the description herein and accompanying drawings.

Of the inventions disclosed by the present application, typical ones will next be outlined briefly.

In one aspect of the present invention, there is thus provided a manufacturing method of a semiconductor device, which comprises opening a connecting hole in an insulating film to expose a silicide layer from the bottom portion of the connecting hole; forming a titanium film by a thermal reaction using a $TiCl_4$ gas; forming a titanium film over the titanium film, which has been formed by the thermal reaction, by a plasma reaction using a $TiCl_4$ gas; subjecting the surface of the titanium film formed by the plasma reaction to first plasma treatment for from 5 to 30 seconds by using an $H_2$ gas; and subjecting the resulting surface to second plasma treatment for from 25 to 75 seconds by using an $NH_3$ gas to form a titanium nitride film having a greater nitrogen content than that of its stoichiometric composition.

In another aspect of the present invention, there is also provided a manufacturing method of a semiconductor device, which comprises placing a semiconductor wafer on a wafer stage of a first chamber of a film forming apparatus and dry cleaning the bottom portion of a connecting hole; placing the semiconductor wafer on a wafer stage of a second chamber of the film forming apparatus and heat treating the semiconductor wafer; placing the semiconductor wafer on a wafer stage of a third chamber of the film forming apparatus, forming a titanium film over the bottom portion of the connecting hole opened in an insulating film by a thermal reaction using a $TiCl_4$ gas, forming a titanium film over the titanium film, which has been formed by the thermal reaction, by a plasma reaction using a $TiCl_4$ gas, subjecting the surface of the titanium film formed by the plasma reaction to first plasma treatment with an $H_2$ gas, and subjecting the surface of the titanium film formed by the plasma reaction to second plasma treatment with an $NH_3$ gas to form a titanium nitride film having a greater nitrogen content than that of its stoichiometric composition; placing the semiconductor wafer on a wafer stage of a fourth chamber of the film forming apparatus to form a seed layer over the titanium nitride film; and forming a metal film over the seed layer by electroplating.

In a further aspect of the present invention, there is also provided a manufacturing method of a semiconductor device, which comprises placing a semiconductor wafer on a wafer stage of a first chamber and dry cleaning the bottom portion of a connecting hole; placing the semiconductor wafer on a wafer stage of a second chamber and heat treating the semiconductor wafer; and placing the semiconductor wafer on a wafer stage of a third chamber, forming a titanium film over the bottom portion of the connecting hole opened in an insulating film by a thermal reaction using a $TiCl_4$ gas, forming a titanium film over the titanium film, which has been formed by the thermal reaction, by a plasma reaction using a $TiCl_4$ gas, subjecting the surface of the titanium film formed by the plasma reaction to first plasma treatment with an $H_2$ gas, and subjecting the surface of the titanium film formed by the plasma reaction to second plasma treatment with an $NH_3$ gas to form a titanium nitride film having a greater nitrogen content than that of its stoichiometric composition.

ADVANTAGE OF THE INVENTION

Advantages available by the typical inventions, of the inventions disclosed by the present application, will next be described briefly.

The present invention makes it possible to avoid an inconvenience at a coupling portion between a barrier metal film obtained by stacking a titanium nitride film over a titanium film and having a film stack structure and a tungsten or copper film filled, via the barrier metal film, in a connecting hole opened in an insulating film. The present invention also makes it possible to improve an operation rate of a multi-chamber type film forming apparatus to be used for the formation of the barrier metal film.

BRIEF DESCRIPTION OF THE DRAWINGS

FIG. 3 is a fragmentary cross-sectional view of the semiconductor substrate illustrating the manufacturing method of SRAM according to the one embodiment of the present invention, in which FIG. 3(a) illustrates a portion (a line A-A' of FIG. 2) of a memory cell region and FIG. 3(b) illustrates a portion of a peripheral circuit region;

FIG. 11 illustrates a process step of a first film forming method in a barrier metal film forming step according to the one embodiment of the present invention;

FIG. 14 illustrates a process step of a second film forming method in the barrier metal film forming step according to the one embodiment of the present invention;

FIG. 16 illustrates a process step of a third film forming method in the barrier metal film forming step according to the one embodiment of the present invention;

FIG. 19 illustrates another process step of a barrier metal film formation step according to the one embodiment of the present invention;

FIG. 21 illustrates a process step of a first film forming method in a tungsten film formation step according to the one embodiment of the present invention;

FIG. 22 illustrates a process step of a second film forming method in a tungsten film formation step according to the one embodiment of the present invention;

FIG. 23 illustrates a process step of a third film forming method in a tungsten film formation step according to the one embodiment of the present invention;

FIG. 24 is a fragmentary cross-sectional view illustrating the same portion as that illustrated in FIG. 3 in a manufacturing step following that of FIG. 20;

FIG. 27 is a fragmentary plan view illustrating the same portion as that illustrated in FIG. 2 in a manufacturing step following that of FIGS. 25 and 26;

DETAILED DESCRIPTION OF THE INVENTION

Figure 1:
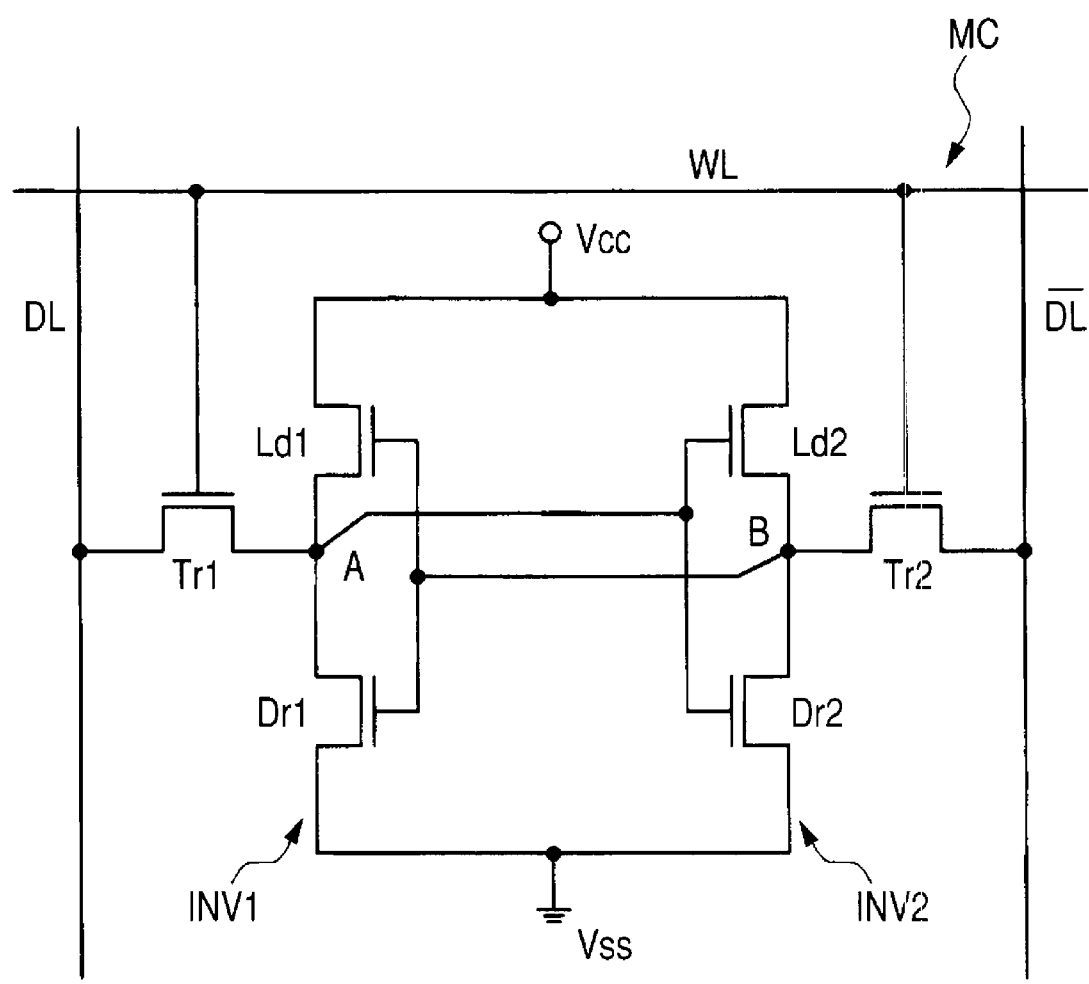
FIG. 1 is an equivalent circuit diagram illustrating the memory cell of SRAM (Static Random Access Memory) according to one embodiment of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range.

In the present embodiments, MIS·FET (Metal Insulator Semiconductor Field Effect Transistor) representative of field effect transistors is abbreviated as MIS, p channel MIS·FET is abbreviated as pMIS, and n channel MIS-FET is abbreviated as nMIS. Even if "MOS" is used for the convenience sake, non-oxide films are not excluded. In the present embodiments, the term "wafer" indicates mainly "Si (Silicon) single crystal wafer", but the term "wafer" indicates not only it but also SOI (Silicon On Insulator) wafer or an insulating film substrate for forming an integrated circuit thereover. The shape of the wafer is not limited to disc or substantially disc, but also square and rectangular wafers are embraced. It is needless to say that the term "silicon film", "silicon portion", "silicon member" or the like means not only a film, portion or member composed of pure silicon but also that containing impurities, an alloy having silicon as a main component such as SiGe or SiGeC (including strained silicon), and that containing additives unless otherwise clearly apparent that it is not or specifically indicated that it is not. It is needless to say that the term "polycrystalline silicon" embraces not only a typical one but also amorphous silicon or the like unless otherwise clearly apparent that it is not or specifically indicated that it is not.

In all the drawings for describing the below-described embodiments, elements having like function will be identified by like reference numerals and overlapping descriptions will be omitted. The embodiments of the present invention will hereinafter be described specifically based on accompanying drawings.

The dry cleaning technology is disclosed in Japanese Patent Application No. 2006-3704 (filed on Jan. 11, 2006) by Ichinose, et al., Japanese Patent Application No. 2006-12355 (filed on Jan. 20, 2006) by Ichinose, et al., Japanese Patent Application No. 2006- 107780 (filed on Apr. 10, 2006) by Ichinose, et al., or Japanese Patent Application No. 2006-

138949 (filed on May 18, 2006) by Ichinose, et al. so that overlapping descriptions will not be included herein in principle.

In the present embodiment, the invention made by the present inventors is applied to a memory cell of SRAM which is an industrial field corresponding to the background of the present invention.

FIG. 1 is an equivalent circuit diagram illustrating the memory cell of SRAM according to the present embodiment.

As illustrated in the diagram, the memory cell MC is placed at an intersection between a pair of complementary data lines (data line DL, data line/(bar) DL) and word line WL and has a pair of drive MISs (Dr1 and Dr2), a pair of load MISs (Ld1 and Ld2) and a pair of transfer MISs (Tr1 and Tr2). The drive MISs (Dr1 and Dr2) and transfer MISs (Tr 1 and Tr2) are made of nMIS, while the load MISs (Ld1 and Ld2) are made of pMIS.

Of the six MISs making up the memory cell MC, the drive MIS (Dr1) and load MIS (Ld1) form a CMOS inverter INV1, while the drive MIS (Dr2) and load MIS (Ld2) form a CMOS inverter INV2. Mutual input/output terminals (memory nodes A and B) for the pair of CMOS inverters INV1 and INV2 are cross-coupled and make up a flip-flop circuit as a data storage element for storing one bit of data. The input/output terminal (memory node A) of this flip-flop circuit is coupled to one of the source and drain of the transfer MIS (Tr1) and the other input/output terminal (memory node B) is coupled to one of the source and drain of the transfer MIS (Tr2).

The other one of the source and drain of the transfer MIS (Tr1) is coupled to the data line DL and the other one of the source and drain of the transfer MIS (Tr2) is coupled to the data line/DL. One end (each source of the load MISs (Ld1 and Ld2)) of the flip-flop circuit is coupled to a supply voltage (Vcc) and the other end (each source of the drive MISs (Dr1 and Dr2)) is coupled to a reference voltage (Vss).

The operation of the above-described circuit will next be described. When the potential of the storage node A of the CMOS inverter INV1 is high ("H"), the drive MIS (Dr2) is turned ON so that the potential of the storage node B of the CMOS inverter INV2 becomes low ("L"). Accordingly, the drive MIS (Dr1) is turned OFF and the potential of the storage node A is kept high "H". This means that the states of both storage nodes A and B are retained by a latch circuit in which the CMOS inverters INV1 and INV2 forming a pair have been cross-coupled and during application of a supply voltage, the data are stored.

Word lines WL are coupled to respective gate electrodes of the transfer MISs (Tr1 and Tr2) and conduction or non-conduction of the transfer MISs (Tr1 and Tr2) is controlled by this word line WL. Described specifically, when the potential of the word line WL is high ("H"), the transfer MISs (Tr1 and Tr2) are turned ON and the flip-flop circuit and complementary data lines (data lines DL and/DL) are electrically coupled so that the potential state ("H" or "L") of the storage node A and B appears in the data lines DL and/DL and is read out as data of the memory cell MC.

The data are written into the memory cell MC by setting the potential level of the word line WL high "H", turning the transfer MISs (Tr1 and Tr2) ON and transmitting the data of the data line DL and/DL to the storage nodes A and B.

Figure 12:
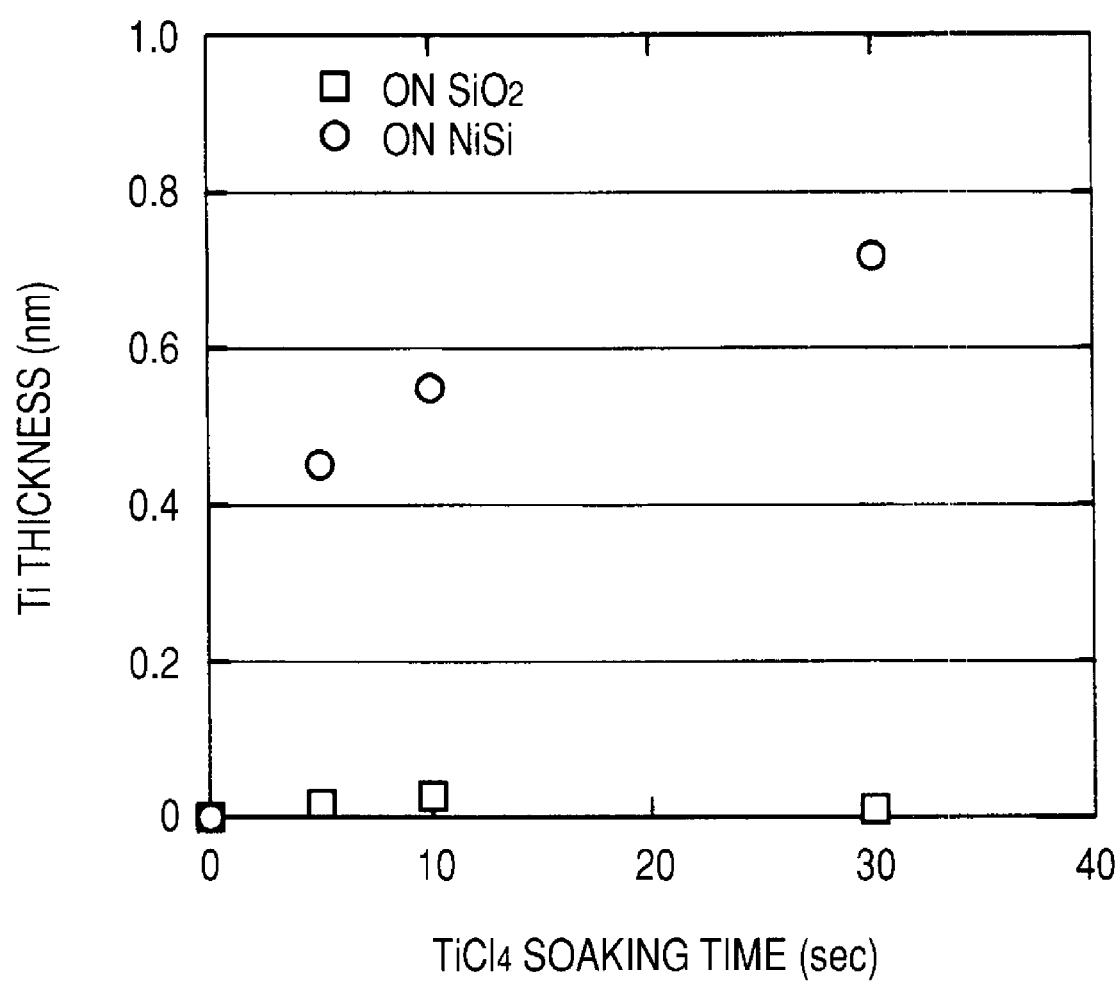
FIG. 12 is a graph showing the relationship between heat treatment time and thickness of a thermal reaction Ti film formed on the bottom of a contact hole having a diameter of 80 nm according to the one embodiment of the present invention.
Figure 20:
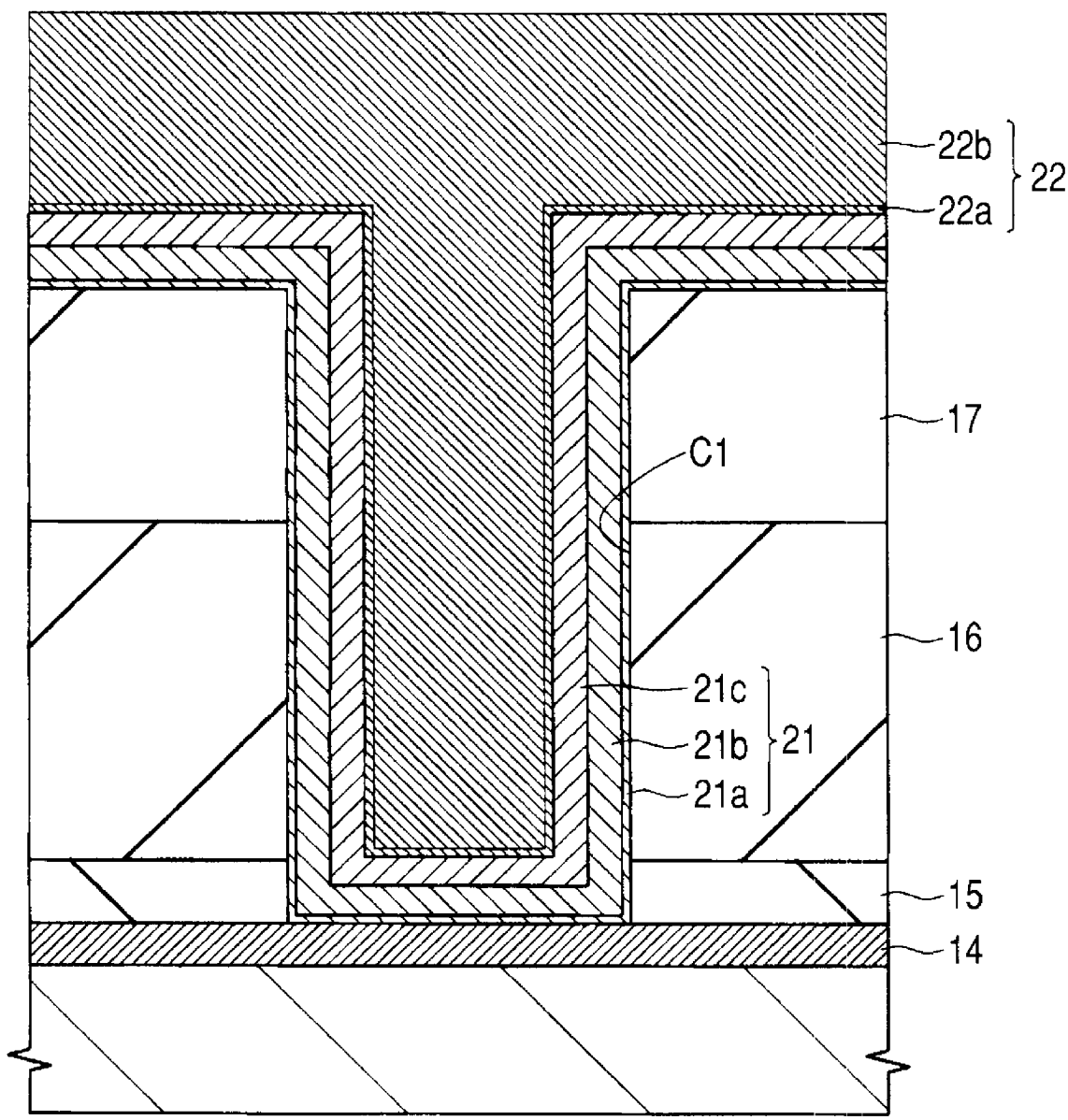
FIG. 20 is a fragmentary enlarged cross-sectional view illustrating the inside of the contact hole during a manufacturing step of SRAM following that illustrated in FIG. 13, 15, 17 or 18.

One example of a manufacturing method of SRAM according to the embodiment of the present invention will next be described in the order of steps with reference to FIGS. 2 to 28. FIGS. 2 to 9 are each a fragmentary plan view or fragmentary cross-sectional view of SRAM; FIG. 10 is a schematic plan view of a barrier metal film forming apparatus; FIGS. 11, 14 and 16 illustrate a process step of the barrier metal film formation step; FIG. 12 is a graph showing the relationship between the heat treatment time and thickness of a thermal reaction Ti film formed on the bottom of a contact hole having a diameter of 80 nm; FIGS. 13, 15, 17 and 18 are fragmentary enlarged cross-sectional views showing a barrier metal film and plug inside the connecting hole; FIG. 19 illustrates a process step of a barrier metal film formation step; FIG. 20 is a fragmentary enlarged cross-sectional view illustrating the inside of the connecting hole; FIGS. 21 to 23 illustrate the process step of a tungsten film formation step; and FIGS. 24 to 28 are each a fragmentary plan view or fragmentary cross-sectional view of SRAM.

Figure 2:
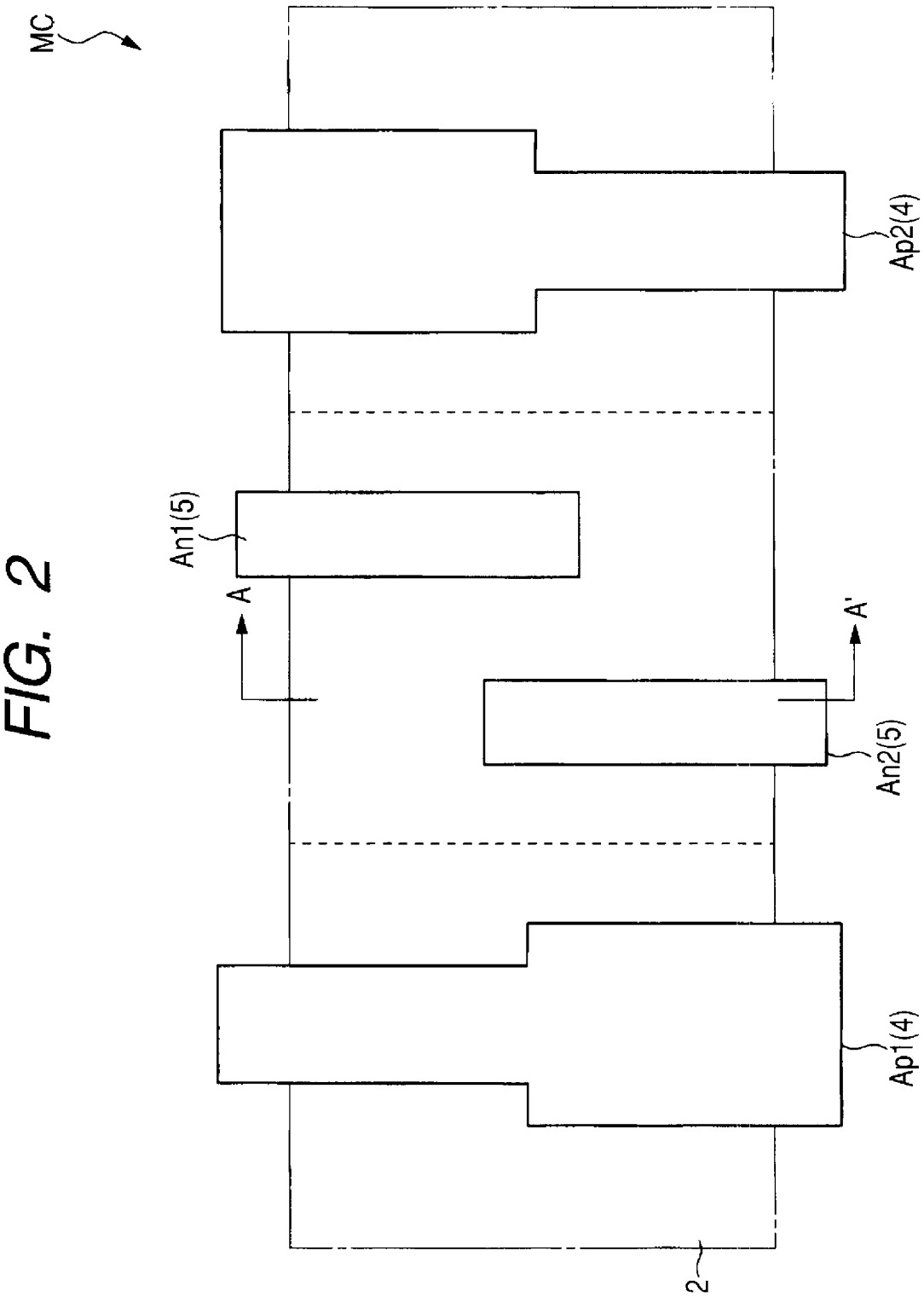
FIG. 2 is a fragmentary plan view of a semiconductor substrate illustrating a manufacturing method of SRAM according to one embodiment of the present invention.

FIG. 2 is a fragmentary plan view of a semiconductor substrate illustrating a region corresponding to about one memory cell; FIG. 3(a) is a fragmentary cross-sectional view of the semiconductor substrate illustrating a portion (a line A-A' of FIG. 2) of a memory cell region; and FIG. 3(b) is a fragmentary cross-sectional view of the semiconductor substrate illustrating a portion of a peripheral circuit region. In the peripheral circuit region, a low breakdown voltage MIS making up a logic circuit is illustrated as an example.

First, a semiconductor substrate 1 is provided. The semiconductor substrate 1 has a substrate 1a made of p type single crystal silicon having a specific resistance of from about 1 to 10 Ωcm and an epitaxial layer 1b formed, for example, by the epitaxial growth.

An element isolation 2 is formed in the main surface of the semiconductor substrate 1. The element isolation 2 is formed in the following manner. After formation of an element isolation trench having a depth of, for example, from about 0.3 to 0.5 μm by etching the semiconductor substrate 1 with a resist pattern formed by photolithography as a mask, the semiconductor substrate 1 is thermally oxidized at a temperature of about 1000° C. to form a silicon oxide film having a thickness of, for example, about 0.01 μm on the inner wall of the trench. This silicon oxide film is formed in order to recover from the etching-derived damage on the inner wall of the trench and at the same time, relax a stress produced at the interface between the semiconductor substrate 1 and an insulating film to be filled inside the trench in the next step.

Over the main surface of the semiconductor substrate 1 including the inside of the trench, an insulating film having a thickness of, for example, about 0.45 to 0.5 μm is deposited by CVD. Then, the insulating film over the trench is polished by chemical mechanical polishing (CMP) to planarize the surface.

Then, a p type impurity (for example, boron) or an n type impurity (for example, phosphorus) is ion-implanted into the main surface of the semiconductor substrate 1, followed by heat treatment at about 1000° C. to diffuse the impurity. A p well 4 and an n well 5 are thus formed in the main surface of the semiconductor substrate 1.

As illustrated in FIG. 2, in the memory cell MC, active regions An1, An2, Ap1 and Ap2 which are main surfaces of two p wells 4 and two n wells 5 are formed over the main surface of the semiconductor substrate 1. These active regions are encompassed by the element isolation 2 having the insulating film filled therein. As will be described later, of the six MISs (transfer MISs (Tr1 and Tr2), drive MISs (Dr1 and Dr2), and load MISs (Ld1 and Ld2) making up the memory cell MC, the nMISs (transfer MIS (Tr1) and drive MIS (Dr1)) are to be formed over the active region Ap1 (p well 4), while the nMIS (transfer MIS (Tr2) and drive MIS (Dr2)) are to be formed over the active region Ap2 (p well 4). The pMIS (load MIS (Ld2) is to be formed over the active region An1 (n well 5) and pMIS (load MIS (Ld1)) is to be formed over the active region An2 (n well 5).

Figure 3:
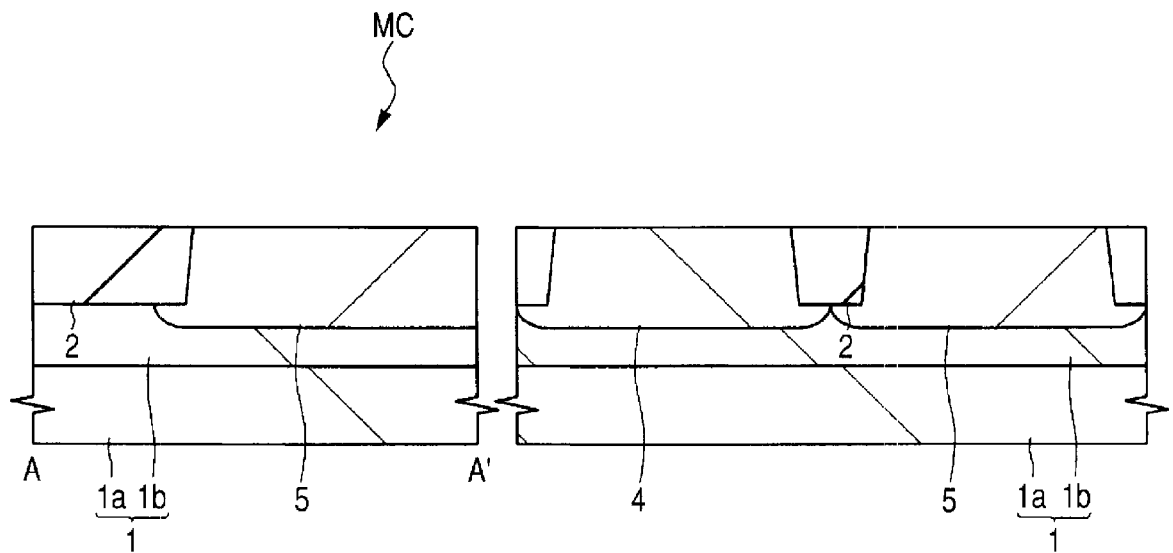
Figure 4:
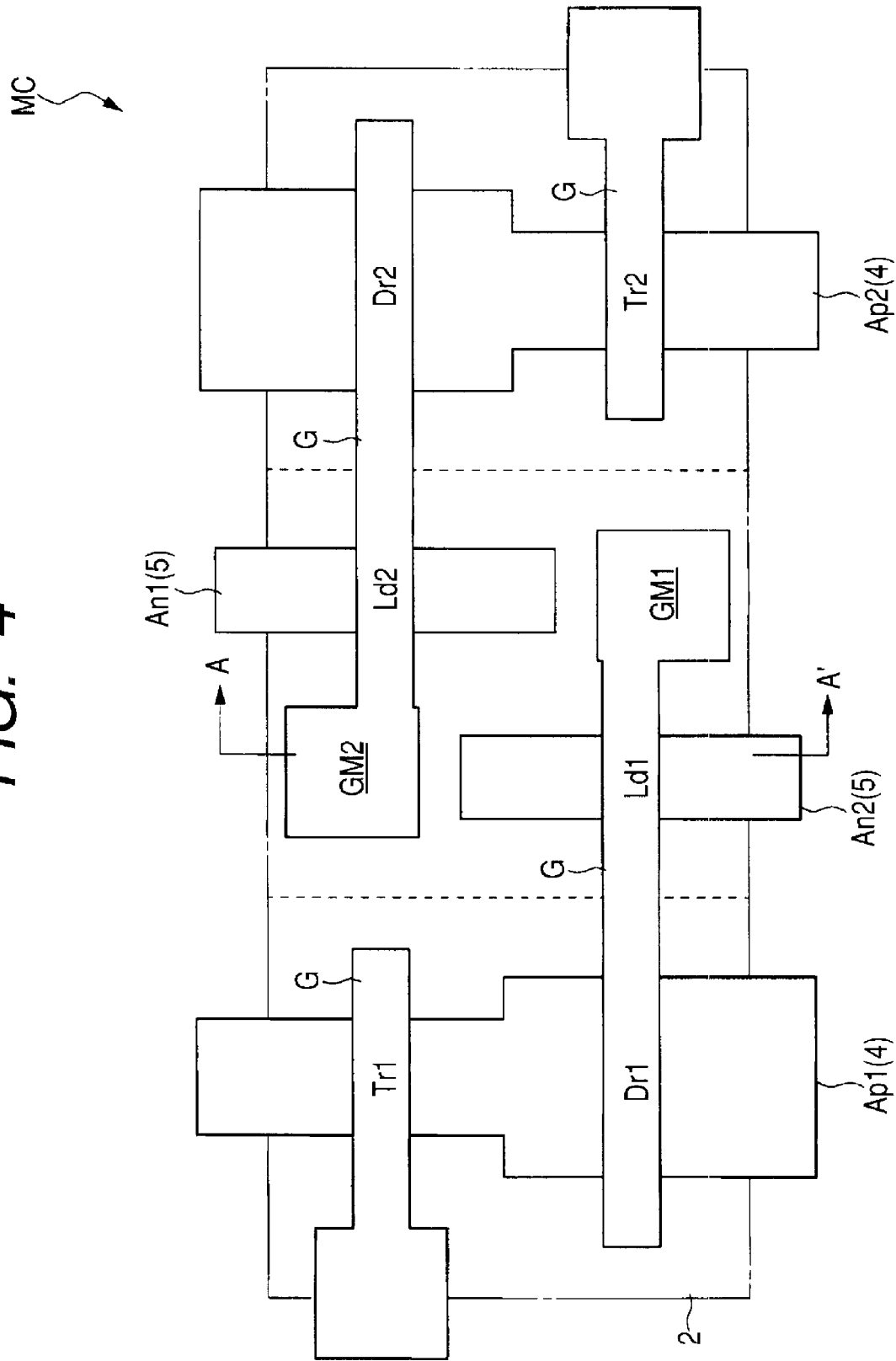
FIG. 4 is a fragmentary plan view illustrating the same portion as that illustrated in FIG. 2 in a manufacturing step following the step of FIGS. 2 and 3.
Figures 5A, 5B:
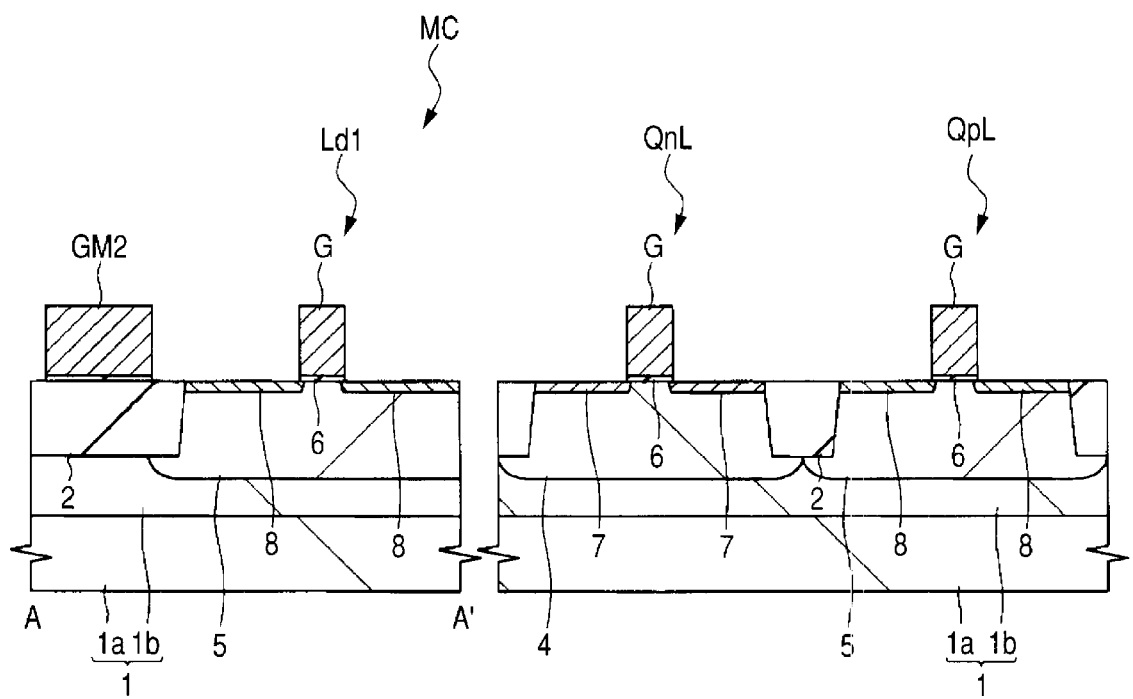
FIG. 5 is a fragmentary cross-sectional view illustrating the same portion as that illustrated in FIG. 3 in a manufacturing step following that of FIGS. 2 and 3.

FIG. 4 is a fragmentary plan view illustrating the same portion as that illustrated in FIG. 2 in a manufacturing step following the step of FIGS. 2 and 3. FIG. 5(a) is a fragmentary cross-sectional view illustrating the same portion as that illustrated in FIG. 3(a) in the manufacturing step following that of FIGS. 2 and 3. FIG. 5(b) is a fragmentary cross-sectional view illustrating the same portion as that illustrated in FIG. 3(b) in a manufacturing step following that of FIGS. 2 and 3.

The nMISs (transfer MISs (Tr1 and Tr2), drive MISs (Dr1 and Dr2) and pMISs (load MIS (Ld1 and Ld2) are formed over the main surface of the memory cell region of the semiconductor substrate 1, while the nMIS (QnL) and pMIS (QpL) are formed over the main surface of the peripheral circuit region of the semiconductor substrate 1.

First, after wet cleaning of the surface of the semiconductor substrate 1 (p well 4 and n well 5) with a hydrofluoric acid type cleaning solution, the substrate is thermally oxidized at about 800° C. to form a clean gate insulating film 6 having a thickness of, for example, about 6 nm over the respective surfaces of the p well 4 and n well 5.

Gate electrodes G are then formed over the gate insulating film 6. The gate electrodes G are formed in the following manner. First, a low-resistance polycrystalline silicon film having a thickness of, for example, about 0.2 µm is formed by CVD over the gate insulating film 6. With a resist pattern formed by photolithography as a mask, the polycrystalline silicon film is dry etched to form the gate electrodes G each made of the polycrystalline silicon film.

As illustrated in FIG. 4, in the memory cell MC, the gate electrode G for the transfer MIS (Tr1) and the gate electrode G for the drive MIS (Dr1) are formed over the active region Ap1, while the gate electrode G for the transfer MIS (Tr2) and the gate electrode G for the drive MIS (Dr2) are formed over the active region Ap2. In addition, the gate electrode G for the load MIS (Ld2) is formed over the active region An1, while the gate electrode G for the load MIS (Ld1) is formed over the active region An2. The load MIS (Ld1) and the drive MIS (Dr1) have the gate electrode G in common and the gate electrode G has, at an end portion thereof, a lead portion GM1 to which a local interconnect is to be coupled in the later step. Similarly, the load MIS (Ld2) and the drive MIS (dr2) have the gate electrode G in common and the gate electrode G has, at an end portion thereof, a lead portion GM2 to which a local interconnect is coupled in the later step. The lead portions GM1 and GM2 are formed over the element isolation 2.

An n type impurity (for example, phosphorus) is ion-implanted into the p well 4 on both sides of the gate electrode G to form n⁻ type semiconductor regions 7, while a p type impurity (for example, arsenic) is ion-implanted into the n well 5 on both side of the gate electrode G to form p⁻ type semiconductor regions 8.

Figures 6A, 6B:
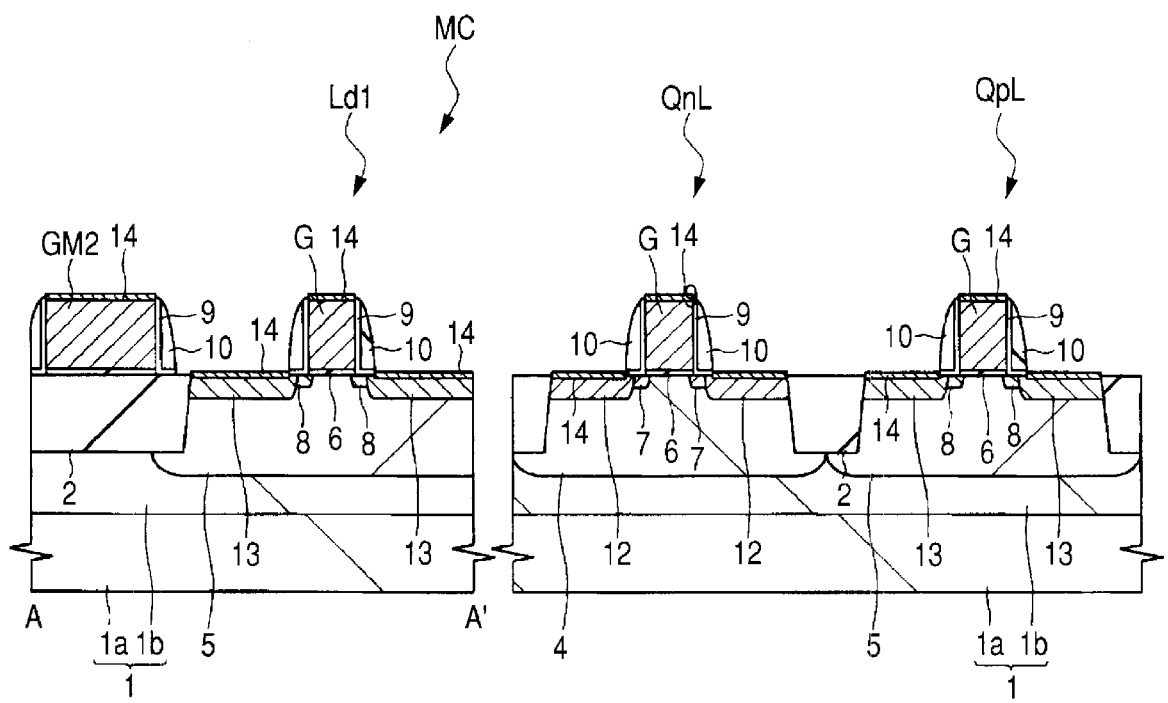
FIG. 6 is a fragmentary cross-sectional view illustrating the same portion as that illustrated in FIG. 3 in a manufacturing step following that of FIGS. 4 and 5.

FIG. 6(a) is a fragmentary cross-sectional view illustrating the same portion as that illustrated in FIG. 3(a) in a manufacturing step following that of FIGS. 4 and 5 and FIG. 6(b) is a fragmentary cross-sectional view illustrating the same portion as that illustrated in FIG. 3(b) in the manufacturing step following that of FIGS. 4 and 5.

After deposition of a silicon oxide film 9 having a thickness of, for example, about 0.01 µm over the main surface of the semiconductor substrate 1 by CVD, a silicon nitride film having a thickness of, for example, about 0.1 µm is deposited. The silicon nitride film thus formed is then anisotropically etched by RIE (Reactive Ion Etching) to form sidewalls 10 over the side walls of the gate electrode G. An etch selectivity of the silicon nitride film relative to the silicon oxide film in this etching can be set at from about 7 to 10 so that the silicon oxide film 9 can serve as an etching stopper at the time of forming the sidewalls 10.

Then, n⁺ type semiconductor regions (source and drain) 12 are formed by ion-implantation of an n type impurity (for example, phosphorus or arsenic) into the p well 4 on both sides of the gate electrode G, while p⁺ type semiconductor regions (source and drain) 13 are formed by ion implantation of a p type impurity (for example, boron) into the n well 5 on both sides of the gate electrode G. The exposed silicon oxide film 9 is then removed.

A low-resistance nickel silicide (NiSi) layer 14 is then formed over the exposed portions (n⁺ type semiconductor regions 12 and p⁺ type semiconductor regions 13) of the semiconductor substrate 1 and the surfaces of the gate electrodes G by the salicide technology. The nickel silicide layer 14 is formed as one example here, but it may be another silicide layer such as nickel alloy silicide layer, cobalt silicide layer, tungsten silicide layer or platinum silicide layer. The nickel silicide layer 14 is formed, for example, in the following manner.

First, a nickel film and a titanium nitride film are deposited successively over the main surface of the semiconductor substrate 1 by sputtering. The nickel film has a thickness of, for example, 0.01 µm and the titanium nitride film has a thickness of, for example, 0.015 µm. The titanium nitride film is formed over the nickel film in order to prevent oxidation thereof and it may be replaced by a titanium film. Then, the nickel silicide layer 14 is formed by heat treating the semiconductor substrate 1 at a temperature of, for example, about 410° C. for about 30 seconds by RTA (Rapid Thermal Anneal) to cause selective reaction between the nickel film and the polycrystalline silicon film making up the gate electrode G, and between the nickel film and single crystal silicon making up the semiconductor substrate 1 in which the n⁺ type semiconductor regions 12 or p⁺ type semiconductor regions 13 have been formed. After removal of the unreacted nickel film and titanium nitride film by wet cleaning with sulfuric acid or wet cleaning with sulfuric acid and aqueous hydrogen peroxide, the semiconductor substrate 1 is heat treated at, for example, about 550° C. for about 30 seconds by using RTA to reduce the resistance of the nickel silicide layer 14.

By the steps so far described, the six MISs making up the memory cell MC (drive MISs (Dr1 and Dr2), transfer MISs (Tr1 and Tr2), and load MISs (Ld1 and Ld2)) and nMIS (QnL) and pMIS (QpL) of the peripheral circuit region are completed.

Figure 7:
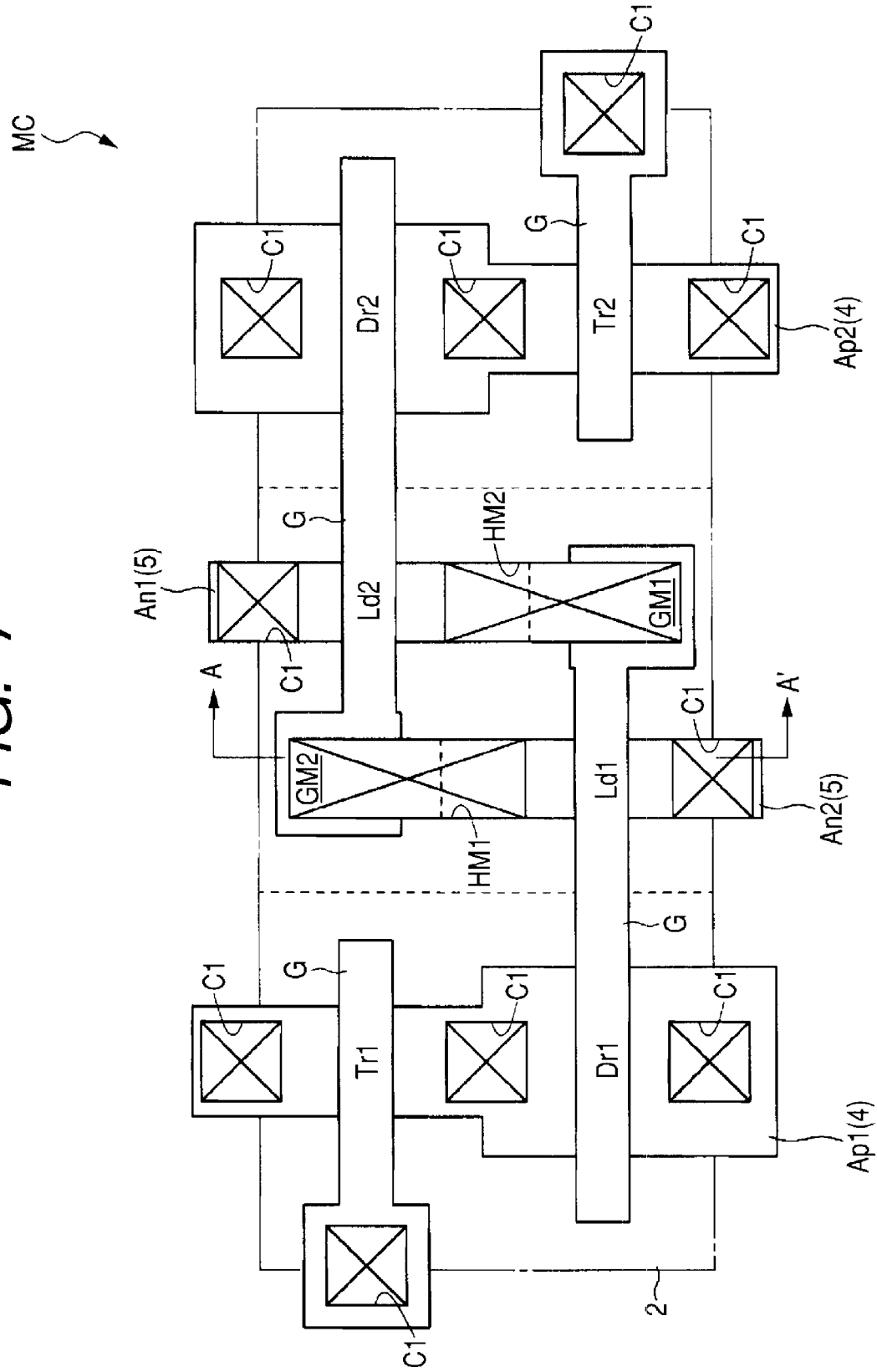
FIG. 7 is a fragmentary plan view illustrating the same portion as that illustrated in FIG. 2 in a manufacturing step following that of FIG. 6.
Figures 8A, 8B:
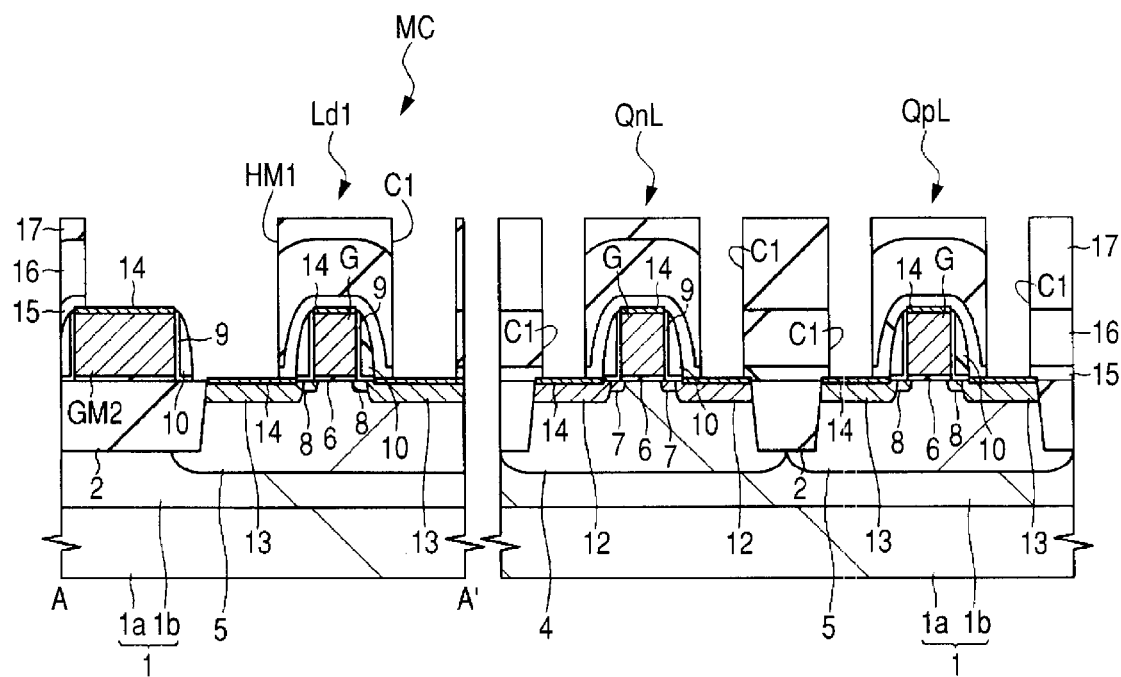
FIG. 8 is a fragmentary cross-sectional view illustrating the same portion as that illustrated in FIG. 3 in a manufacturing step following that of FIG. 6.

FIG. 7 is a fragmentary plan view of the same portion as that illustrated in FIG. 2 in a manufacturing step following that of FIG. 6, FIG. 8(a) is a fragmentary cross-sectional view illustrating the same portion as that illustrated in FIG. 3(a) in a manufacturing step following that of FIG. 6 and FIG. 8(b) is a fragmentary cross-sectional view illustrating the same portion as that illustrated in FIG. 3(b) in a manufacturing step following that of FIG. 6.

A silicon nitride film 15 having a thickness of, for example, from about 0.03 to 0.05 µm is deposited over the semiconductor substrate 1 by CVD. The silicon nitride film 15 serves as an etching stopper during the formation of contact holes and the like which will be described later.

A PSG (Phosphor Silicate Glass) film 16 is then formed over the silicon nitride film 15, followed by heat treatment to planarize it. A silicon oxide film 17 is then deposited. The silicon oxide film 17 is formed, for example, using tetraethoxysilane as a raw material by plasma CVD. The silicon nitride film 15, PSG film 16 and silicon oxide film 17 will be an interlayer dielectric, for example, between the gate electrode G and an interconnect formed later. Alternatively, after deposition of the silicon oxide film 17 having a thickness of, for example, from about 0.7 to 0.8 µm over the silicon nitride film 15, the surface of the silicon oxide film 17 may be polished by CMP to planarize the surface thereof.

With a resist pattern formed by photolithography as a mask, the silicon oxide film 17 and PSG film 16 are dry etched, followed by dry etching of the silicon nitride film 15 to form contact holes C1 over the $n^+$ type semiconductor regions 12 and $p^+$ type semiconductor regions 13. Moreover, first and second interconnect trenches (shared opening portions (shared contacts)) HM1 and HM2 are formed. A contact hole C1 is formed over the lead portion of the gate electrode G of the transfer MISs (Tr1 and Tr2).

Of these first and second interconnect trenches HM1 and HM2, the first interconnect trench HM1 extends from the upper portion of the drain of the load MIS (Ld1) to the upper portion of the lead portion GM2 of the gate electrode G which the load MIS (LD2) and drive MIS (Dr2) making up the CMOS inverter INV2 have in common. This means that the first interconnect trench HM1 is a trench serving as both a contact hole for coupling the lead portion GM2 of the gate electrode G and a local interconnect which will be formed later and a contact hole for coupling the drain of the load MIS (Ld1) and the local interconnect. The second interconnect HM2 extends from the upper portion of the load MIS (Ld2) to the upper portion of the lead portion GM1 of the gate electrode G which the load MIS (Ld1) and drive MIS (Dr1) of the CMOS inverter INV1 have in common. This means that the second interconnect trench HM1 is a trench serving as both a contact hole for coupling the lead portion GM1 of the gate electrode G and a local interconnect which will be formed later and a contact hole for coupling the drain of the load MIS (Ld2) and the local interconnect.

At the time of the formation of the contact holes C1 and first and second interconnect trenches HM1 and HM2, the silicon oxide film 17 and PSG film 16 are dry etched with the silicon nitride film 15 functioned as an etching stopper. The etch selectivity of the silicon oxide film 17 or PSG film 16 to the silicon nitride film 15 is, for example, from about 20 to 30 so that the silicon nitride film 15 can serve as an etching stopper of the silicon oxide film 17 and PSG film 16.

The exposed silicon nitride film 15 is then dry etched. During this etching, the silicon nitride film 15 is overetched in order to completely expose the nickel silicide layer 14 formed over the surfaces of the $p^+$ type semiconductor regions 13 in a region in which the first and second interconnect trenches HM1 and HM2 are to be formed and the nickel silicide layer 14 formed over the surface of the lead portion GM1 of the gate electrode G which the load MIS (Ld1) and drive MIS (Dr1) making up the CMOS inverter INV1 have in common and the surface of the lead portion GM2 of the gate electrode G which the load MIS (Ld2) and the drive MIS (Dr2) making up the CMOS inverter INV2 have in common. By this overetching, the sidewalls 10 formed over the side walls of the lead portion GM1 of the gate electrode G which the load MIS (Ld1) and drive MIS (Dr1) making up the CMOS inverter INV1 have in common and the side walls of the lead portion GM2 of the gate electrode G which the load MIS (Ld2) and the drive MIS (Dr2) making up the CMOS inverter INV2 have in common may be etched to expose the end portions of the nickel silicide layer 14 or polycrystalline silicon film making up the lead portions GM1 and GM2 of the gate electrode G. As a result, an oxide film may grow at some portions of the surface of the nickel silicide layer 14.

Figures 9A, 9B:
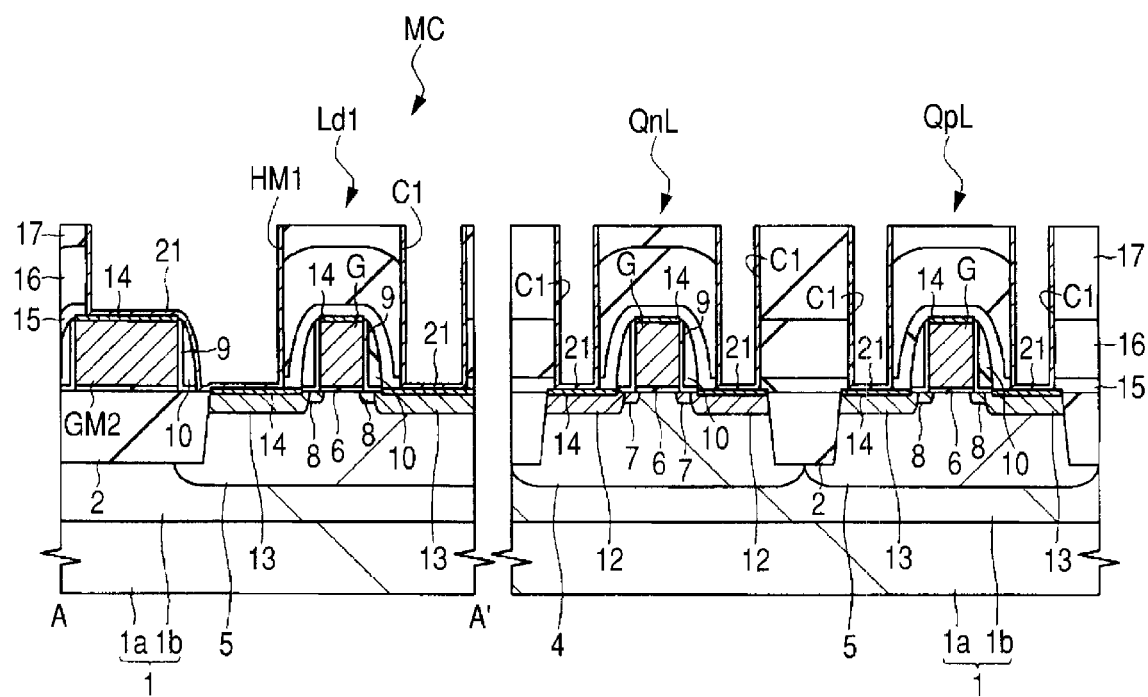
FIG. 9 is a fragmentary cross-sectional view illustrating the same portion as that illustrated in FIG. 3 in a manufacturing step following that of FIGS. 7 and 8.
Figure 10:
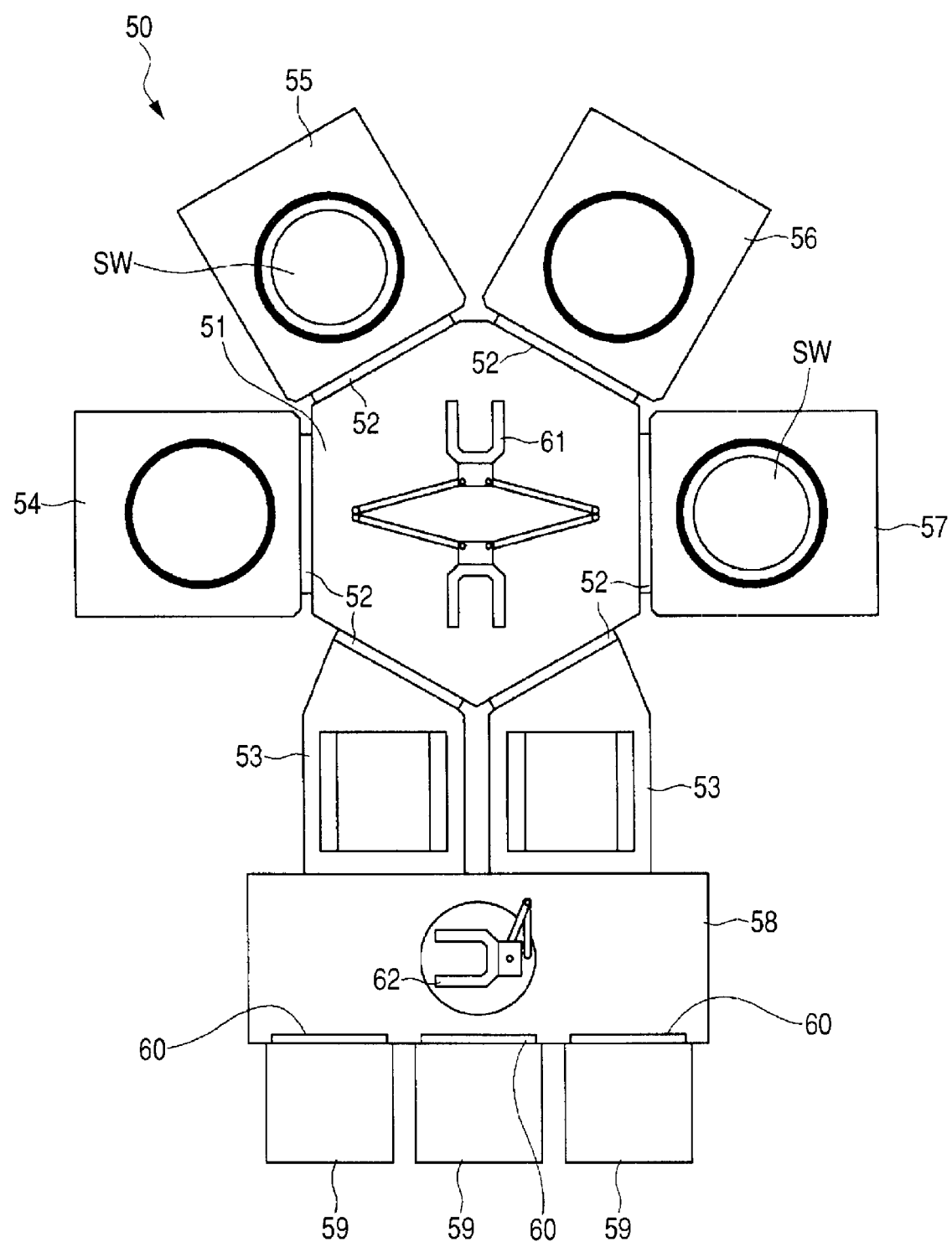
FIG. 10 is a schematic plan view of a barrier metal film forming apparatus according to the one embodiment of the present invention.

FIG. 9(a) is a fragmentary cross-sectional view illustrating the same portion as illustrated in FIG. 3(a) in a manufacturing step following that of FIGS. 7 and 8 and FIG. 9(b) is a fragmentary cross-sectional view illustrating the same portion as illustrated in FIG. 3(b) in the manufacturing step following that of FIGS. 7 and 8.

A titanium film and a titanium nitride film are formed successively over the silicon oxide film 17 including the insides of the contact holes C1 and the first and second interconnect trenches HM1 and HM2 by CVD to form a barrier metal film 21 made of the resulting film stack. The titanium film permits formation of a solid solution containing up to 25 at % of atomic oxygen therein so that it is used as a reducing material of the surface of the nickel silicide layer 14 and has a function of reducing the contact resistance with the nickel silicide layer 14. The titanium nitride film has, on the other hand, a function of suppressing or preventing the diffusion of atoms making up a metal film to be filled later in the contact holes C1 and first and second interconnect trenches HM1 and HM2. The barrier metal film 21 has a thickness of from 3 to 10 nm. It is to be noted that the titanium film and the titanium nitride film formed thereover will be called "barrier metal film 21" collectively and are distinguished from a metal film, such as tungsten film or copper film, to be filled in the contact holes C1 and the first and second interconnect trenches HM1 and HM2 and serving as a main conductive material.

A film forming apparatus 50 as illustrated in FIG. 10 is employed for the formation of the barrier metal film 21. The film forming apparatus 50 is a multi-chamber type apparatus equipped with a transfer chamber 51 and, thereabound, a loadlock chamber 53 and four chambers 54, 55, 56 and 57 via gate valves 52 serving as switching means. The apparatus has, on the side of the loadlock chamber 53 opposite to the transfer chamber 51, a wafer carrying in-and-out chamber 58. On the side of the carrying in-and-out chamber 58 opposite to the loadlock chamber 53, the apparatus has a port 60 for attaching a FOUP (Front Open Unified Pod) 59 in which a semiconductor wafer SW (in this embodiment, a semiconductor substrate having a structure as described above and illustrated in FIG. 9) is housed.

The transfer chamber 51 is maintained at a predetermined degree of vacuum by an exhaust mechanism or the like and it has, on the center thereof, a transfer robot 61 having a multijoint arm structure for transferring the semiconductor wafers SW.

The transfer chamber 51 has a chamber (first chamber) 54 for dry cleaning treatment, a chamber (second chamber) 55 for heat treatment at high temperatures, for example, 150° C. or greater, and chambers (third chambers) 56 and 57 for the formation of a barrier metal film. It is to be noted that chambers of the transfer chamber 51 of this film forming apparatus 50 is not limited to these four chambers, but a chamber having the same using purpose or a chamber having another using purpose can be added.

First, a single semiconductor wafer SW is taken out from any one of the FOUPs 59 by a transfer robot 62 placed in the wafer carrying in-and-out chamber 58 and transferred to either one of the loadlock chambers 53. The FOUP 59 is a hermetically sealed container for batch transfer of semiconductor wafers SW and usually stores therein a batch of 25, 12 or 6 semiconductor wafers. The outside wall of the container of the FOUP 59 has an air tight structure except for a minute ventilation filter portion and dusts are eliminated from the FOUP substantially completely. Accordingly, even when they are transferred in an atmosphere of cleanliness class 1000, the inside of the container can be kept at cleanliness class 1. Docking with the film forming apparatus 50 is conducted while keeping the cleanliness by drawing the door of the FOUP 59, which has been attached to the port 60, inward to the wafer carrying in-and-out chamber 58. After the loadlock chamber 53 is vacuumed, the semiconductor wafer SW is carried in the transfer chamber 51 by the aid of the transfer robot 61.

The semiconductor wafer SW is then vacuum-transferred from the transfer chamber 51 to the chamber 54 for dry cleaning treatment by the aid of the transfer robot 61 and placed on a wafer stage of the chamber 54. The wafer stage of the chamber 54 is equipped with a mechanism of holding the wafer by the electrostatic adsorption, whereby the temperature of the wafer can be controlled efficiently. During dry cleaning treatment, a reducing gas (seventh reaction gas) such as an Ar gas added with an HF gas and $NH_3$ gas is introduced into the chamber 54 and supplied onto the main surface of the semiconductor wafer SW via a shower head. By the reduction reaction, for example, represented by the formula (1) that occurs between the reducing gas and a natural oxide film formed on the surface of the nickel silicide layer 14, the natural oxide film is removed. The dry cleaning treatment is performed, for example, under the following conditions: wafer stage temperature of 25° C., HF gas flow rate of 80 sccm, $NH_3$ gas flow rate of 38 sccm, Ar gas flow rate of 5 sccm, and pressure of 1.3 Pa.

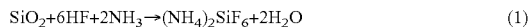

$$SiO_2 + 6HF + 2NH_3 \rightarrow (NH_4)_2SiF_6 + 2H_2O \quad (1)$$

A product $((NH_4)_2SiF_6)$ formed by the above-described reduction reaction remains over the main surface of the semiconductor wafer SW including the insides of the contact holes C1 and first and second trenches HM1 and HM2.

The semiconductor wafer SW is then vacuum-transferred from the dry cleaning chamber 54 to the heat treatment chamber 55 via the transfer chamber 51 by the aid of the transfer robot 61 and is then placed on a stage of the chamber 55. By placing the semiconductor wafer SW on the stage of the chamber 55, the semiconductor wafer SW is heated at a predetermined temperature and the product which has remained on the main surface of the wafer SW is removed by sublimation. As the temperature on the main surface of the semiconductor wafer SW, a range of from 150 to 400° C. may be adequate (it is needless to say that the temperature is not limited to this range and varies, depending on conditions). A temperature range suited for mass production may be from 165 to 350° C., but a range of from 180 to 220° C., that is, a temperature with 200° C. as a center value is most suited.

The barrier metal film 21 is then formed. Since the product formed on the bottom and side surfaces of the contact holes C1 and first and second trenches HM1 and HM2 during the dry cleaning treatment has already been removed by the heat treatment given to the semiconductor substrate 1 at from 150 to 400° C. after the dry cleaning treatment, variations in the contact resistance between the barrier metal film 21 and nickel silicide layer 14 on the bottom surface of the contact holes C1 and first and second trenches HM1 and HM2 can be decreased. In addition, peeling of the barrier metal film 21 on the side surface of the contact holes C1 and first and second trenches HM1 and HM2 can be prevented. An oxide film which has grown on the surface of the nickel silicide layer 14 however cannot be removed by the above-described dry cleaning treatment and heat treatment and has still remained at portions from which end portions of the nickel silicide layer 14 or polycrystalline silicon film making up the lead portions GM1 and GM2 of the gate electrode G are exposed by the above-described overetching during formation of the contact holes C1 and first and second trenches HM1 and HM2.

In the above dry cleaning treatment, HF gas and $NH_3$ gas are employed as reducing gases. No particular limitation is however imposed on the reaction gas such as reducing gas insofar as it forms, as a result of reaction with an oxide film at a relatively low temperature, a reactive species that vaporizes. For example, an $NF_3$ gas and $H_2$ gas may be used as the reducing gas.

In the above dry cleaning treatment, a reaction gas such as reducing gas is introduced into the chamber 54 to remove the natural oxide film by a reduction reaction. Instead of a gas, plasma is usable. For example, plasma is formed by excitation of an Ar gas (Ar gas is used frequently as a gas for plasma excitation, but another dilute gas or mixture thereof is also usable) added with a reducing gas, for example, an $NF_3$ gas or $NH_3$ gas, and the resulting plasma is introduced into the chamber 54 to remove the natural oxide film by a reduction reaction.

The semiconductor wafer SW is then vacuum-transferred from the heat treatment chamber 55 to the barrier metal film forming chamber 56 or chamber 57 via the transfer chamber 51 by the aid of the transfer robot 61 and placed on a stage of the chamber 56 or 57.

The film forming apparatus 50 is equipped with two barrier metal film forming chambers 56 and 57 having the same function and same structure. Since the film forming apparatus 50 is equipped with two chambers 56 and 56 equal in function and structure, the barrier metal film 21 can be formed without stopping the film forming apparatus 50 by using, even if one of the chambers, for example, the chamber 56 comes to stop, the other chamber, for example, chamber 57. This leads to improvement in the operation rate of the film forming apparatus 50.

In the chamber 56 (or chamber 57), the barrier metal film 21 is formed over the main surface of the semiconductor wafer SW by PECVD which will be described later. The first to fourth film forming methods of the barrier metal film 21 will next be described herein. It is however to be noted that the method of forming the barrier metal film 21 is not limited thereto but various modifications of them can be employed.

Figure 13:
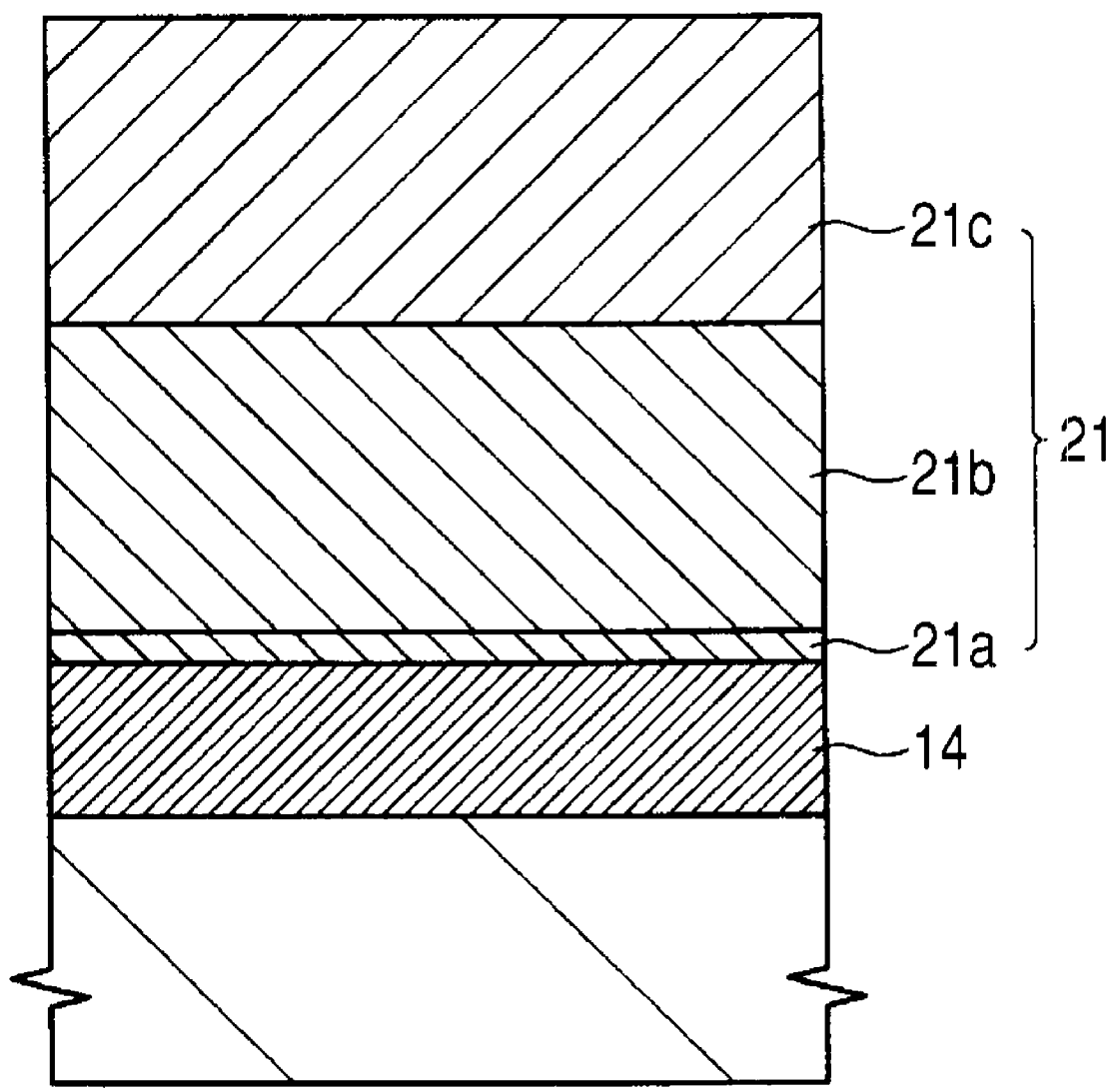
FIG. 13 is a fragmentary enlarged cross-sectional view showing a barrier metal film and plug inside a contact hole during a manufacturing step of SRAM following that of FIG. 9.

The first film forming method of the barrier metal film 21 will next be described with reference to FIGS. 11 and 13.

[Step 1] The semiconductor wafer SW is placed on a stage heated by a heater to a predetermined temperature, for example, 450° C. During from [Step 1] to [Step 10], the stage is constantly heated to a predetermined temperature, for example, 450° C. An Ar gas and $H_2$ gas are introduced by an exhaust mechanism into the chamber to adjust the pressure therein to a predetermined pressure, for example, 667 Pa within a time predetermined in [Step 1], for example, 5 seconds. The flow rate of the Ar gas is, for example, 800 sccm, while that of the $H_2$ gas is, for example, 4000 sccm.

[Step 2] After adjustment of the pressure and the flow rates of the Ar gas and $H_2$ gas to predetermined values, the semiconductor wafer SW is heated for a predetermined time. During from [Step 2] to [Step 9], the pressure in the chamber is maintained at a predetermined level (for example, 667 Pa) and during from [Step 2] to [Step 10], the Ar gas and $H_2$ gas are introduced into the chamber constantly at predetermined flow rates (for example, 800 sccm and 4000 sccm, respectively).

[Step 3] A $TiCl_4$ gas (first reaction gas) is supplied from a supply source of a $TiCl_4$ gas but it is diverted just upstream of the chamber until the flow rate becomes stable. The flow rate of the $TiCl_4$ gas is, for example, 6.7 sccm.

[Step 4] After the flow rate of the $TiCl_4$ gas becomes stable, the $TiCl_4$ gas is introduced into the chamber to selectively form a titanium film (which will hereinafter be called "thermal reaction Ti film"; first metal film) 21a on the surface of the nickel silicide layer 14 by the thermal reaction. The flow rate of the $TiCl_4$ gas is, for example, 6.7 sccm and the heat treatment time is, for example, from 5 to 30 seconds. The thermal reaction Ti film 21a has a thickness of for example 1 nm or less. The thermal reaction Ti film 21a is formed only on the surface of the nickel silicide layer 14 exposed from the bottom surface of the contact holes C1 and the bottom surface of the first and second trenches HM1 and HM2 and is not formed on the side walls of the contact holes C1 and the side walls of the first and second trenches HM1 and HM2 and the upper surface of the silicon oxide film 17. Even on the bottom surface of the first and second interconnect trenches HM1 and HM2, when the nickel silicide layer 14 has, on the surface thereof, an oxide film, the thermal reaction Ti film 21a is not formed on the bottom surface of the first and second interconnect trenches HM1 and HM2.

[Step 5] By generating plasma in the chamber by the application of RF power, a titanium film (which will hereinafter be called "plasma reaction Ti film"; second metal film) 21b is formed on the thermal reaction Ti film 21a. The flow rate of the $TiCl_4$ gas is, for example, 6.7 sccm, the RF power is, for example, 800 W and film formation time is, for example, 25 seconds. The thickness of the plasma reaction Ti film 21b is from 2 nm to 5 nm.

[Step 6] Plasma treatment (first plasma treatment) of the plasma reaction Ti film 21b is performed using an $H_2$ gas (second reaction gas) while stopping only the introduction of the $TiCl_4$ gas into the chamber. A chlorine concentration of the plasma reaction Ti film 21b is reduced and the oxide film which has remained between the plasma reaction Ti film 21b and the nickel silicide layer 14 on the bottoms of the first and second interconnect trenches HM1 and HM2 is reduced (the thermal reaction Ti film 21a is not formed when an oxide film is present on the bottoms of the first and second interconnect trenches HM1 and HM2). The plasma treatment time is, for example, 5 seconds.

[Step 7] Application of RF power is terminated and the $TiCl_4$ gas is purged from the chamber.

[Step 8] An $NH_3$ gas (third reaction gas) is introduced into the chamber to nitride the surface of the plasma reaction Ti film 21b by a thermal reaction and reduce the oxide film which has remained between the plasma reaction Ti film 21b and the nickel silicide layer 14 on the bottoms of the first and second interconnect trenches HM1 and HM2. The flow rate of the $NH_3$ gas is, for example, 500 sccm and the heat treatment time is, for example, from 0 to 75 seconds.

[Step 9] By producing plasma by applying RF power (second plasma treatment), a titanium nitride film (which will hereinafter be called "nitrogen-rich TiN film"; first metal nitride film) 21c having a slightly greater nitrogen content than that of its stoichiometric composition, for example, a $Ti_1N_{1.1}$ film is formed on the surface of the plasma reaction Ti film 21b and the oxide film which has remained between the plasma reaction Ti film 21b and the nickel silicide layer 14 on the bottoms of the first and second interconnect trenches HM1 and HM2 is reduced. The RF power is, for example, 800 W and nitriding time is, for example, 25 seconds or greater, for example, from 25 to 75 seconds.

[Step 10] After application of RF power is stopped and introduction of the $NH_3$ gas into the chamber is stopped, the $NH_3$ gas is purged from the chamber.

By the first film forming method, a barrier metal film 21 composed of the thermal reaction Ti film 21a, plasma reaction Ti film 21b and nitrogen-rich TiN film 21c is formed. The thermal reaction Ti film 21a has a thickness of, for example, 1 nm or less, the plasma reaction Ti film 21b has a thickness of, for example, 5 nm, and the nitrogen-rich TiN film 21c has a thickness of, for example, from 3 to 5 nm.

The thermal reaction Ti film 21a permits a decrease in the contact resistance with the nickel silicide layer 14. This low contact resistance is presumed to result from (1) the formation of $(Ni_1Ti_{1-x})Si$ on the interface between the nickel silicide layer 14 and thermal reaction Ti film 21a, (2) a smaller impurity concentration in the thermal reaction Ti film 21a than that in the plasma reaction Ti film 21b because pure titanium is formed by the thermal decomposition reaction with nickel silicide as a catalyst, and (3) reduction of titanium chloride by an ultratrace amount of fluorine remaining after the dry cleaning treatment. The nitrogen-rich TiN film 21c is effective as a barrier film for suppressing or preventing diffusion of constituent atoms of the plug. Moreover, the concentration of an impurity, such as chlorine, contained in the plasma reaction Ti film 21b decreases by the plasma treatment in [Step 6]. After the formation of the thermal reaction Ti film 21a/plasma reaction Ti film 21b, the film is subjected to plasma treatment with an $H_2$ gas for from 5 to 30 seconds. Then, the surface of the plasma reaction Ti film 21b is subjected to thermal nitriding treatment with an $NH_3$ gas for from 0 to 75 seconds and plasma treatment with an $NH_3$ gas for from 25 to 75 seconds, whereby H atoms passing through the plasma reaction Ti film 21b can reduce the oxide film which has remained between the plasma reaction Ti film 21b and the nickel silicide layer 14 on the bottoms of the first and second interconnect trenches HM1 and HM2.

Figure 15:
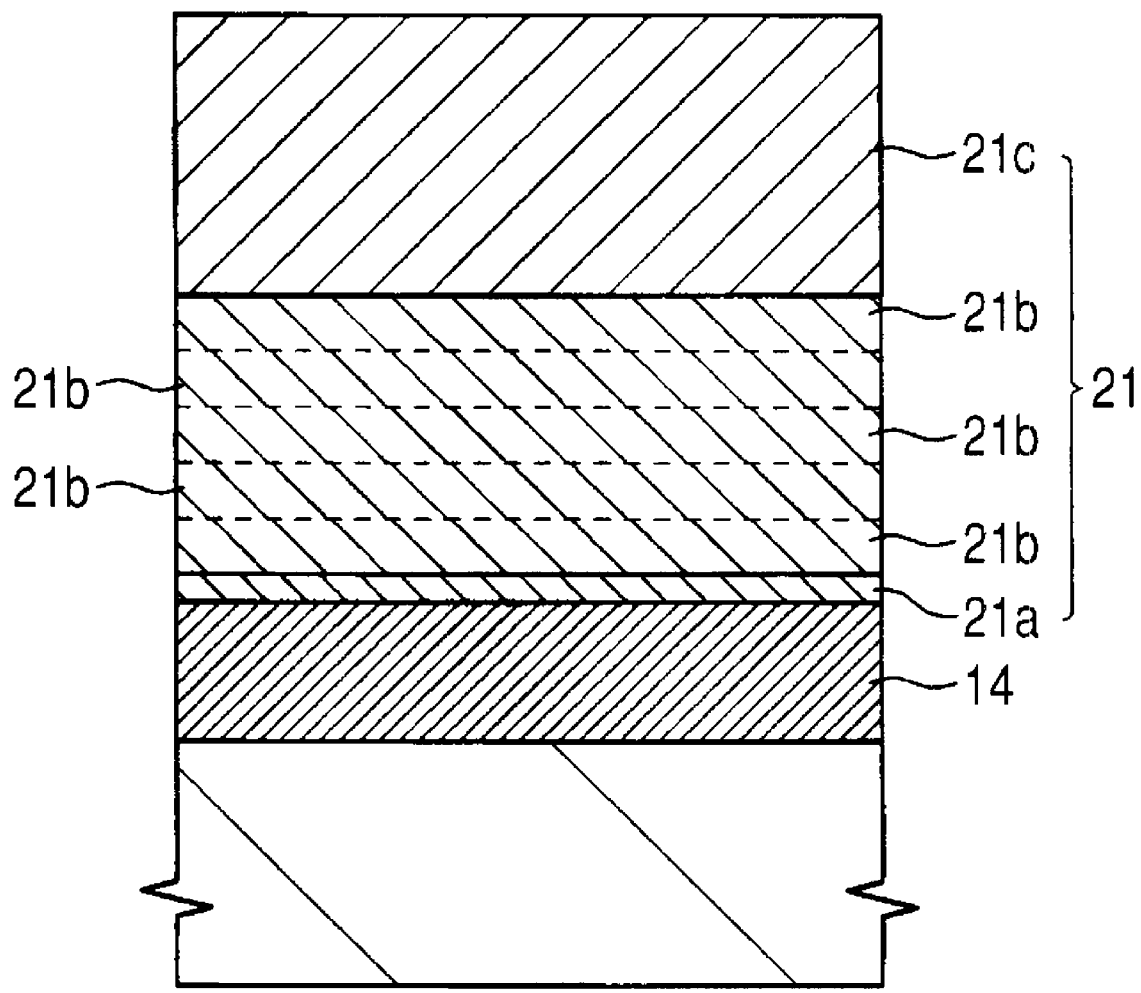
FIG. 15 is a fragmentary enlarged cross-sectional view illustrating the same portion as that illustrated in FIG. 13 during a manufacturing step of SRAM following that of FIG. 9.

The second film forming method of the barrier metal film 21 will next be described with reference to FIGS. 14 and 15.

The second film forming method is similar in steps from [Step 1] to [Step 6] to the first film forming method so that description on them is omitted. It is however to be noted that the formation time of the plasma reaction Ti film 21b in [Step 5] is, for example, 5 seconds, while the plasma treatment time in [Step 6] is, for example, 5 seconds.

[Step 7] A $TiCl_4$ gas is supplied from a supply source of a $TiCl_4$ gas and it is diverted just upstream of the chamber until the flow rate becomes stable. The flow rate of the $TiCl_4$ gas is, for example, 6.7 sccm.

[Step 8] After the flow rate of the $TiCl_4$ gas becomes stable, another plasma reaction Ti film 21b is formed on the plasma reaction Ti film 21b by introducing the $TiCl_4$ gas into the chamber and applying RF power to generate plasma. The flow rate of the $TiCl_4$ gas is, for example, 6.7 sccm, the RF power is, for example 800 W, and the film formation time is, for example, 5 seconds. The another plasma reaction Ti film 21b has a thickness of, for example, from 1 to 2 nm.

[Step 9] By stopping only the introduction of the $TiCl_4$ gas into the chamber and carrying out plasma treatment of the plasma reaction Ti film 21b with an $H_2$ gas, a chlorine concentration of the plasma reaction Ti film 21b is decreased and the oxide film which has remained between the plasma reaction Ti film 21b and the nickel silicide layer 14 on the bottoms of the first and second interconnect trenches HM1 and HM2 is reduced. Steps from [Step 7] to [Step 9] are carried out multiple times, for example, four times. The time spent for single plasma treatment in [Step 9] is set at, for example, 5 seconds so that the total plasma treatment time in [Step 6] and [Step 9] will be from 25 to 75 seconds. The total thickness of the plasma reaction Ti films 21b becomes, for example, from 5 to 10 nm.

[Step 10] The application of RF power is terminated and the $TiCl_4$ gas is purged from the chamber.

[Step 11] An $NH_3$ gas is introduced into the chamber to nitride the surface of the plasma reaction Ti film 21b by a thermal reaction and reduce the oxide film which has remained between the plasma reaction Ti film 21b and the nickel silicide layer 14 on the bottoms of the first and second interconnect trenches HM1 and HM2. The flow rate of the NH₃ gas is, for example, 500 sccm and heat treatment time is, for example, from 0 to 75 seconds.

[Step 12] With plasma generated by application of RF power, a nitrogen-rich TiN film 21c is formed on the surface of the plasma reaction Ti film 21b and the oxide film which has remained between the plasma reaction Ti film 21b and the nickel silicide layer 14 on the bottoms of the first and second interconnect trenches HM1 and HM2 is reduced. The RF power is, for example, 800 W and nitriding treatment time is, for example, 25 seconds or greater, for example, from 25 to 75 seconds.

[Step 13] After application of RF power is stopped and introduction of the NH₃ gas is also stopped, the NH₃ gas is purged from the chamber.

By the second film forming method, a barrier metal film 21 composed of the thermal reaction Ti film 21a, (multistage) plasma reaction Ti film 21b, and nitrogen-rich TiN film 21c is formed. The thermal reaction Ti film 21a has a thickness of, for example, 1 nm or less, the plasma reaction Ti film 21b has a thickness of, for example, 5 nm, and the nitrogen-rich TiN film 21c has a thickness of for example, from 3 to 5 nm.

As in the first film forming method, the thermal reaction Ti film 21a permits a decrease in the contact resistance with the nickel silicide layer 14 and the nitrogen-rich TiN film 21c is effective as a barrier film for suppressing or preventing diffusion of constituent atoms of the plug. In addition, the oxide film which has remained between the plasma reaction Ti film 21b and the nickel silicide layer 14 on the bottoms of the first and second interconnect trenches HM1 and HM2 can be reduced.

Moreover, in the process having [Steps 5 and 6]+([Steps 7, 8 and 9])×4, the formation of the plasma reaction Ti film 21b and reduction can be carried out alternately in a relatively short time so that the concentration of an impurity such as chlorine not only on the surface of the plasma reaction Ti film 21b but also therein can be decreased, making it possible to obtain the plasma reaction Ti film 21b having a low specific resistance and therefore having good quality.

Figure 17:
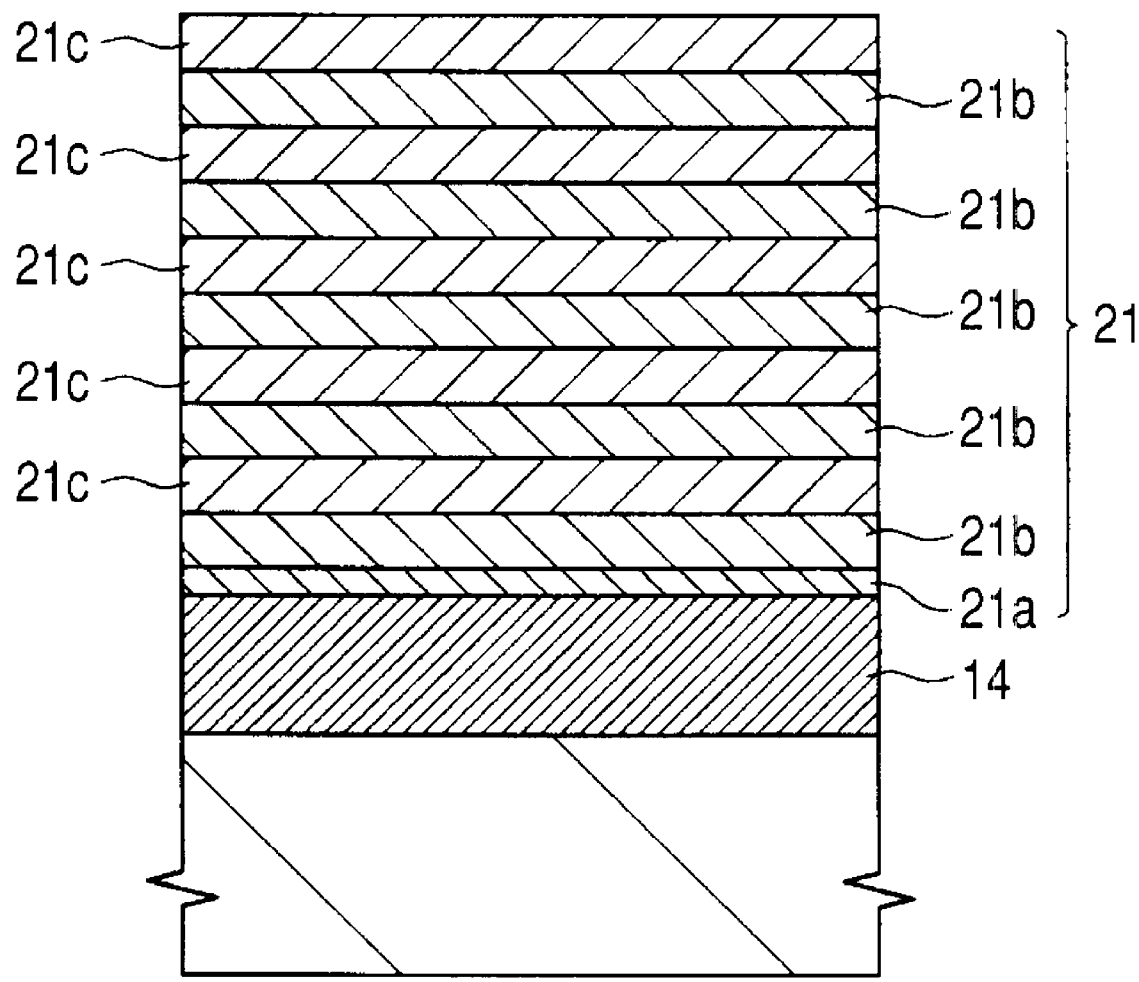
FIG. 17 is a fragmentary enlarged cross-sectional view illustrating the same portion as that illustrated in FIG. 13 during a manufacturing step of SRAM following that of FIG. 9.

The third film forming method of the barrier metal film 21 will next be described with reference to FIGS. 16 and 17.

The third film forming method is similar in steps from [Step 1] to [Step 10] to the first film forming method so that description on them is omitted. It is however to be noted that the film formation time of the plasma reaction Ti film 21b in [Step 5] is, for example, 5 seconds, the plasma treatment time in [Step 6] is, for example, 5 seconds, the thermal nitridation time in [Step 8] is, for example, 10 seconds, and the plasma treatment time in [Step 9] is, for example, 5 seconds.

[Step 11] A TiCl₄ gas is supplied from a supply source of a TiCl₄ gas and it is diverted just upstream of the chamber until the flow rate becomes stable. The flow rate of the TiCl₄ gas is, for example, 6.7 sccm.

[Step 12] After the flow rate of the TiCl₄ gas becomes stable, a plasma reaction Ti film 21b is formed over the nitrogen-rich TiN film 21c by introducing the TiCl₄ gas into the chamber and applying RF power to generate plasma. The flow rate of the TiCl₄ gas is, for example, 6.7 sccm, the RF power is, for example 800 W, and the film formation time is, for example, 5 seconds. The plasma reaction Ti film 21b has a thickness of, for example, from 1 to 2 nm.

[Step 13] By stopping only the introduction of the TiCl₄ gas into the chamber, plasma treatment of the plasma reaction Ti film 21b is performed with an H₂ gas, a chlorine concentration of the plasma reaction Ti film 21b is decreased, and the oxide film which has remained between the plasma reaction Ti film 21b and the nickel silicide layer 14 on the bottoms of the first and second interconnect trenches HM1 and HM2 is reduced. The plasma treatment time is, for example, 5 seconds.

[Step 14] The application of RF power is stopped and the TiCl₄ gas is purged from the chamber.

[Step 15] An NH₃ gas is introduced into the chamber to nitride the surface of the plasma reaction Ti film 21b by a thermal reaction and reduce the oxide film which has remained between the plasma reaction Ti film 21b and the nickel silicide layer 14 on the bottoms of the first and second interconnect trenches HM1 and HM2. The flow rate of the NH₃ gas is, for example, 500 sccm and heat treatment time is, for example, 10 seconds.

[Step 16] By the application of RF power, plasma is generated to form a nitrogen-rich TiN film 21c on the surface of the plasma reaction Ti film 21b and reduce the oxide film which has remained between the plasma reaction Ti film 21b and the nickel silicide layer 14 on the bottoms of the first and second interconnect trenches HM1 and HM2. The RF power is, for example, 800 W and nitriding time is, for example, 5 seconds.

[Step 17] After application of RF power is stopped and introduction of an NH₃ gas into the chamber is stopped, an NH₃ gas is purged from the chamber.

Steps from [Step 11] to [Step 17] are performed multiple times, for example, four times. Although the plasma treatment time with an H₂ gas in [Step 6] and [Step 13] is set at, for example, 5 seconds, thermal nitridation time with an NH₃ gas in [Step 8] and [Step 15] is set at, for example, 10 seconds, and the plasma treatment time with an NH₃ gas in [Step 9] and [Step 16] is set at, for example, 5 seconds, the treatment time is not limited to them. The treatment time in each step can be set so that the total plasma treatment time with an H₂ gas will be from 5 to 30 seconds, the thermal nitridation time with an NH₃ gas will be from 0 to 75 seconds, and the total plasma treatment time with an NH₃ gas will be from 25 to 75 seconds.

A barrier metal film 21 composed of the thermal reaction Ti film 21a and (plasma reaction Ti film 21b and nitrogen-rich TiN film 21c)×5 is formed by the third film forming method. The thermal reaction Ti film 21a has a thickness of, for example, 1 nm or less and the (plasma reaction Ti film 21b+ nitrogen-rich TiN film 21c)×5 has a thickness of from 5 to 10 nm.

As in the first film forming method, the thermal reaction Ti film 21a permits a decrease in the contact resistance with the nickel silicide layer 14 and the nitrogen-rich TiN film 21c is effective as a barrier film for suppressing or preventing diffusion of constituent atoms of the plug. In addition, the oxide film which has remained between the plasma reaction Ti film 21b and the nickel silicide layer 14 on the bottoms of the first and second interconnect trenches HM1 and HM2 can be reduced.

Moreover, in the process having [Steps 5, 6, 7, 8, 9 and 10]+([Steps 11, 12, 13, 14, 15, 16 and 17])×4, by carrying out a series of procedures composed of formation of the plasma reaction Ti film 21b, reduction, and nitriding multiple times in a relatively short time, the concentration of an impurity such as chlorine can be decreased and therefore, the plasma reaction Ti film 21b having a low specific resistance and having good quality can be obtained. At the same time, a nitrogen-rich TiN film 21c capable of effectively functioning as a barrier film can be formed on the surface of the plasma reaction Ti film 21b.

Figure 18:
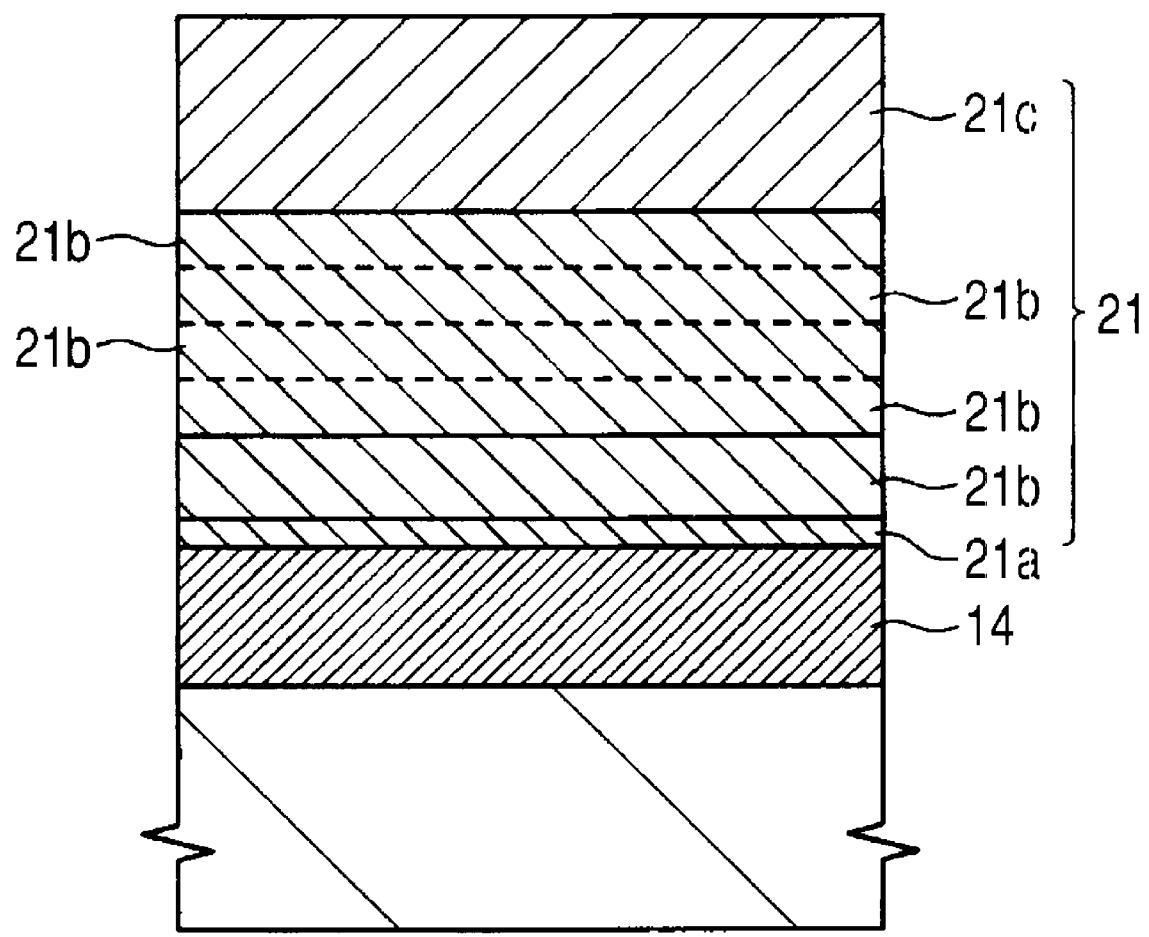
FIG. 18 is a fragmentary enlarged cross-sectional view illustrating the same portion as that illustrated in FIG. 13 during a manufacturing step of SRAM following that of FIG. 9.

The fourth film forming method of the barrier metal film 21 will next be described with reference to FIGS. 14 and 18.

The fourth film forming method is similar in steps from [Step 1] to [Step 6] to the second film forming method so that a description on them is omitted. The fourth film forming method is however different from the second film forming method in that the film formation time of the plasma reaction Ti film 21b in [Step 5] is, for example, from 5 seconds to 15 seconds and the first-stage plasma reaction Ti film 21b is thicker than the first-stage plasma reaction Ti film 21b formed by the second film forming method. Steps of the fourth film forming method from [Step 7] to [Step 13] are similar to those of the second film forming method so that a description on them is also omitted.

A barrier metal film 21 composed of the thermal reaction Ti film 21a, plasma reaction Ti film 21b, (multistage) plasma reaction Ti film 21b, and nitrogen-rich TiN film 21c is formed by the fourth film forming method. The thermal reaction Ti film 21a has a thickness of, for example, 1 nm or less, the plasma reaction Ti film 21b lying as a lower layer has a thickness of, for example, 3 nm and the plasma reaction Ti films 21b lying as upper layers have a thickness of from 4 to 5 nm.

As in the first film forming method, the thermal reaction Ti film 21a permits a decrease in the contact resistance with the nickel silicide layer 14 and the nitrogen-rich TiN film 21c is effective as a barrier film for suppressing or preventing diffusion of constituent atoms of the plug. In addition, the oxide film which has remained between the plasma reaction Ti film 21b and the nickel silicide layer 14 on the bottoms of the first and second interconnect trenches HM1 and HM2 can be reduced.

Moreover, in the process of [Steps 5 and 6] and [Steps 7, 8 and 9], by carrying out the formation of the plasma reaction Ti film 21b and reduction in a relatively short time, the concentration of an impurity such as chlorine decreases and therefore, the plasma reaction Ti film 21b having a low specific resistance and having good quality is available.

The barrier metal film 21 having a low impurity concentration, for example, a low chlorine concentration can be formed by any one of the first to fourth film forming methods. This contributes to a decrease in the resistance of the nickel silicide layer 14 and prevention of peeling or microcracks of the barrier metal film 21. In addition, the oxide film which has remained between the plasma reaction Ti film 21b and the nickel silicide layer 14 on the bottoms of the first and second interconnect trenches HM1 and HM2 can be reduced.

The semiconductor wafer SW is then vacuum transferred from the barrier metal film forming chamber 56 (or chamber 57) to either one of the loadlock chambers 53 by the aid of the transfer robot 61 and is then returned to any one of the FOUPs 59 from the loadlock chamber 53 via the wafer carrying in-and-out chamber 58 by the aid of the transfer robot 62.

The barrier metal film 21 formed by any one of the first to fourth film forming methods is effective as a barrier film for suppressing or preventing diffusion of constituent atoms of the plug and has the nitrogen-rich TiN film 21c. The barrier metal film 21 may be imparted with a higher barrier function by forming thereover a titanium nitride film (second metal nitride film) having a thickness of, for example, from 0 to 5 nm by thermal CVD at from about 450 to 480° C. while using, for example, a TiCl$_4$ gas and an NH$_3$ gas (fourth reaction gas).

The film forming method of the titanium nitride film to be formed over the barrier metal film 21 by thermal CVD will hereinafter be described briefly with reference to FIG. 19. This titanium nitride film may be formed in another chamber coupled to the above-described film forming apparatus 50. Alternatively, it may be formed using a CVD apparatus different from the above described film forming apparatus 50. The film forming method of the titanium nitride film is not limited to the following one but various modifications thereof can be employed.

[Step 1] A semiconductor wafer SW is placed on a stage heated to a predetermined temperature, for example, 480° C. by a heater. During from [Step 1] to [Step 12], the stage is constantly heated to the predetermined temperature. An N$_2$ gas and NH$_3$ gas which are carrier gases of a TiCl$_4$ gas and NH$_3$ gas, respectively, are introduced into the chamber so that the pressure in the chamber will be a predetermined one by an exhaust mechanism within a time set in [Step 1].

[Step 2] After the pressure and the flow rates of the N$_2$ gas and NH$_3$ gas are adjusted to predetermined values, the semiconductor wafer SW is heated for a predetermined time.

[Step 3] At the same time, a TiCl$_4$ gas is supplied from a TiCl$_4$ gas supply source and the TiCl$_4$ gas is diverted just upstream of the chamber until the flow rate becomes stable.

[Step 4] to [Step 10] A TiCl$_4$ gas and an NH$_3$ gas are introduced simultaneously into the chamber when a titanium nitride film is deposited by using the TiCl$_4$ gas and NH$_3$ gas. The flow rates of the TiCl$_4$ gas and NH$_3$ gas are, for example, 60 sccm, pressure is, for example, 260 Pa, and deposition time is, for example, 6 seconds. When a thick titanium nitride film is formed, steps from [Step 4] to [Step 10] are performed multiple times. For example, a titanium nitride film of 5 nm thick can be formed by conducting steps from [Step 4] to [Step 10] six times.

[Step 11] and [Step 12] After the application of RF power is stopped and the introduction of the TiCl$_4$ gas and NH$_3$ gas into the chamber is stopped, an N$_2$ gas is introduced into the chamber to purge therefrom the TiCl$_4$ gas and NH$_3$ gas. The introduction of the N$_2$ gas into the chamber is then stopped and the chamber is vacuumed.

As illustrated in FIG. 20, a metal film, for example, a tungsten film 22 is deposited by CVD on the barrier metal film 21 including the insides of the contact holes C1 and first and second interconnect trenches HM1 and HM2. In forming the tungsten film 22, a nucleation film of tungsten (which will hereinafter be called "tungsten nucleation film"; metal nucleation film) 22a is formed on the barrier metal film 21, followed by the deposition of a tungsten film (which will hereinafter be called "blanket-tungsten film"; metal film) 22b to fill therewith the insides of the contact holes C1 and the first and second interconnect trenches HM1 and HM2. In the present embodiment, the tungsten nucleation film 22a thus formed has a multilayer structure having a thickness of, for example, 0.01 μm or less. The tungsten nucleation film 22a exhibits good adhesion with the nitrogen-rich TiN film 21c present as the uppermost layer of the barrier metal film 21 and has a function of suppressing or preventing penetration of fluorine contained in a WF$_6$ gas, a gas for forming the tungsten film, into the barrier metal film 21 so that fluorine-induced corrosion (for example, blister or peeling of the plasma reaction Ti film 21b) of the barrier metal film 21 can be avoided.

The first, second and third formation methods of the tungsten film 22 will hereinafter be described. In the first film forming method, after simultaneous supply of a WF$_6$ gas, SiH$_4$ gas and H$_2$ gas into a chamber, a tungsten nucleation film 22a and a blanket-tungsten film 22b are formed successively. In the second film forming method, after adsorption of tungsten and fluorine to the surface of the barrier metal film 21 by using a WF$_6$ gas, fluorine is removed by the reduction reaction using an SiH$_4$ gas to form a tungsten nucleation film 22a, followed by the formation of a blanket-tungsten film 22b. In the third film forming method, after adsorption of tungsten and fluorine to the surface of the barrier metal film 21 by using a WF$_6$ gas, fluorine is removed by the reduction reaction using a B$_2$H$_6$ gas to form a tungsten nucleation film 22a, followed by the formation of a blanket-tungsten film 22b. The film forming method of the tungsten film 22 (tungsten nucleation film 22a and blanket-tungsten film 22b) is not limited to the above-described ones and various modifications thereof can be employed.

The first film forming method is performed as described below, for example, in accordance with the process steps shown in FIG. 21.

[Step 1] and [Step 2] A tungsten nucleation film 22a having a predetermined thickness is formed on the surface of the barrier metal film 21 by introducing a $WF_6$ gas (fifth reaction gas), $SiH_4$ gas and $H_2$ gas (first reducing gas) at respective predetermined flow rates. The pressure in the chamber and the temperature of the semiconductor wafer are set at, for example, 2667 Pa and 390° C., respectively. By controlling the time (A1) of [Step 2], a tungsten nucleation film 22a having a desired thickness can be formed. The tungsten nucleation film 22a has a thickness of, for example, 7 nm. By the simultaneous introduction of a $WF_6$ gas and $SiH_4$ gas into the chamber, film formation and removal of fluorine can be accomplished simultaneously so that a tungsten nucleation film 22a having a small fluorine content can be formed.

[Step 3] to [Step 6] After introduction of an $H_2$ gas (second reducing gas) into the chamber at a predetermined flow rate, a $WF_6$ gas (sixth reaction gas) is introduced into the chamber at a predetermined flow rate, for example, 250 sccm, whereby a blanket-tungsten film 22b is formed on the tungsten nucleation film 22a by $H_2$ reduction. The pressure in the chamber and the temperature of the semiconductor wafer are set at, for example, 10666 Pa and 400° C. or less, for example, 390° C., respectively. By controlling the time (A2) of [Step 5], a blanket-tungsten film 22b having a desired thickness can be formed. The blanket-tungsten film 22b has a thickness of, for example, 0.193 μm. After formation of the blanket-tungsten film 22b, the pressure and flow rate of the $WF_6$ gas are reduced to 0 Pa and 0 sccm, respectively.

By the first film forming method using reduction with $SiH_4$ for the nucleation, the tungsten film 22 composed of the tungsten nucleation film 22a having a small fluorine content and the blanket-tungsten film 22b can be formed. The film forming temperature of the blanket-tungsten film 22b is, for example, 390° C. Formation of the tungsten film 22 at a relatively low temperature not greater than 400° C. makes it possible to suppress penetration of fluorine contained in the $WF_6$ gas at the time of formation of the blanket-tungsten film 22b. Penetration of fluorine contained in the $WF_6$ gas into the barrier metal film 21 can therefore be suppressed or prevented so that fluorine-induced corrosion of the barrier metal film 21 can be prevented.

The second film forming method is performed as described below, for example, in accordance with the process steps shown in FIG. 22.

[Step 1] and [Step 2] A $WF_6$ gas (fifth reaction gas) is introduced into the chamber at a predetermined flow rate, for example, 160 sccm to cause adsorption of tungsten and fluorine to the surface of the barrier metal film 21 and a tungsten nucleation film of about 1 nm thick is formed. The pressure in the chamber is, for example, 1000 Pa and the temperature of the semiconductor wafer is, for example, 350° C. The supply of the $WF_6$ gas into the chamber is then stopped.

[Step 3] and [Step 4] An $SiH_4$ gas (first reducing gas) is introduced into the chamber at a predetermined flow rate, for example, 400 sccm and fluorine is removed from the tungsten nucleation film by $SiH_4$ reduction. The pressure in the chamber is, for example, 1000 Pa and the temperature of the semiconductor wafer is, for example, 350° C. The supply of the $SiH_4$ gas into the chamber is then stopped. Steps from [Step 1] to [Step 4] is performed multiple times, for example, seven times to form a tungsten nucleation film 22a having a multilayer structure. The tungsten nucleation film 22a has a thickness of, for example, 7 nm.

[Step 5] to [Step 9] After introduction of an $H_2$ gas (second reducing gas) into the chamber at a predetermined flow rate, for example, 4000 sccm, a $WF_6$ gas (sixth reaction gas) is introduced into the chamber at a predetermined flow rate, for example, 60 sccm. The flow rate of the $WF_6$ gas is then increased to, for example, 350 sccm and the pressure is raised to, for example, 10666 Pa. The temperature of the semiconductor wafer is also raised but is set at 400° C. or less, for example, 390° C. A blanket-tungsten film 22b is then formed over the tungsten nucleation film 22a by making use of $H_2$ reduction. After formation of the blanket-tungsten film 22b having a desired thickness, the pressure and flow rate of the $WF_6$ gas are reduced to 0 Pa and 0 sccm, respectively. The blanket-tungsten film 22a has a thickness of, for example, 0.193 μm.

By the second film forming method employing nucleation by $SiH_4$ reduction, the tungsten film 22 composed of the tungsten nucleation film 22a and blanket-tungsten film 22b is formed. Since the tungsten nucleation film 22a has a multilayer structure, the interface between layers becomes discontinuous, which disturbs easy penetration, through the tungsten nucleation film 22a, of fluorine contained in the $WF_6$ gas at the time of forming the blanket-tungsten film 22b. In addition, the film formation temperature of the blanket-tungsten film 22b is, for example, 390° C. Formation of the tungsten film 22 at a relatively low temperature not greater than 400° C. makes it possible to prevent penetration of fluorine contained in the $WF_6$ gas at the time of forming the blanket-tungsten film 22b. Penetration, into the barrier metal film 21, of fluorine contained in the $WF_6$ gas can therefore be suppressed or prevented so that fluorine-induced corrosion of the barrier metal film 21 can be prevented.

The third film forming method will be performed as described below, for example, in accordance with the process steps shown in FIG. 23.

[Step 1] and [Step 2] A tungsten nucleation film of about 1 nm thick is formed by introducing a $WF_6$ gas (fifth reaction gas) into a chamber at a predetermined flow rate, for example, 160 sccm and causing adsorption of tungsten and fluorine to the surface of the barrier metal film 21. The pressure in the chamber is, for example, 1000 Pa and the temperature of the semiconductor wafer is, for example, 350° C. Supply of the $WF_6$ gas into the chamber is then terminated.

[Step 3] and [Step 4] A 5% $B_2H_6$ gas (first reducing gas) diluted with an $H_2$ gas is introduced into the chamber at a predetermined flow rate, for example, 1000 sccm and fluorine is removed from the tungsten nucleation film by $B_2H_6$ reduction. The pressure in the chamber is, for example, 1000 Pa and the temperature of the semiconductor wafer is, for example, 350° C. Supply of the 5% $B_2H_6$ gas diluted with an $H_2$ gas to the chamber is then terminated. Steps from [Step 1] to [Step 4] are performed in multiple times, for example, eight times, whereby a tungsten nucleation film 22a having a multilayer structure is formed. The tungsten nucleation film 22a has a thickness of, for example, 7 nm and it has an amorphous structure.

[Step 5] to [Step 10] After introduction of an $H_2$ gas (second reducing gas) into the chamber at a predetermined flow rate, for example, 4000 sccm, a $WF_6$ gas (sixth reaction gas) is introduced into the chamber at a predetermined flow rate, for example, 60 sccm. The flow rate of the $WF_6$ gas and pressure in the chamber are increased to, for example, 200 sccm and 10666 Pa, respectively. The temperature of the semiconductor wafer is also increased, but it does not exceed 400° C. and it is, for example, 390° C. A blanket-tungsten film 22b is formed over the tungsten nucleation film 22a by making use of $H_2$ reduction. After formation of the blanket-tungsten film 22b having a desired thickness, the pressure and flow rate of the $WF_6$ gas are decreased to 0 Pa and 0 sccm, respectively. The blanket-tungsten film 22b has a thickness of, for example, 0.193 μm.

In accordance with the third film forming method employing the nucleation by $B_2H_6$ reduction, the tungsten film 22 composed of the tungsten nucleation film 22a and blanket-tungsten film 22b is formed. Similar to the second film forming method employing the nucleation by $SiH_4$ reduction, the multilayer structure of the tungsten nucleation film 22a makes the interface between layers discontinuous. In addition, the amorphous structure of the tungsten nucleation film 22a disturbs penetration of fluorine, which has been contained in the $WF_6$ gas at the time of formation of the blanket-tungsten film 22b, through the tungsten nucleation film 22a. Moreover, the blanket-tungsten film 22b is formed at, for example, 390° C. The formation of the tungsten film 22 at a relatively low temperature not greater than 400° C. makes it possible to prevent penetration of fluorine which has been contained in the $WF_6$ gas at the time of formation of the blanket-tungsten film 22b. These enable suppression or prevention of penetration of fluorine contained in the $WF_6$ gas into the barrier metal film 21, resulting in the prevention of fluorine-induced corrosion of the barrier metal film 21.

FIG. 24(a) is a fragmentary cross-sectional view illustrating the same portion as that illustrated in FIG. 3(a) in a manufacturing step following that of FIG. 20; and FIG. 24(b) is a fragmentary cross-sectional view illustrating the same portion as that illustrated in FIG. 3(b) in the manufacturing step following that of FIG. 20.

As illustrated in FIG. 24, etchback or CMP is performed until the surface of the silicon oxide film 17 is exposed and the titanium film, titanium nitride film and tungsten film outside the contact holes C1 and first and second interconnect trenches HM1 and HM2 are removed, whereby a plug P1 using the tungsten film 22 as a main conductive material is formed inside the contact holes C1 and local interconnects 23a (refer to FIG. 25) and 23b are formed inside the first and second interconnect trenches HM1 and HM2.

The local interconnect 23a is coupled to the lead portion GM2 of the gate electrode G which the drain of the load MIS (Ld1), the source of the transfer MIS (Tr1), and the load MIS (Ld2) and drive MIS (Dr2) making up the CMOS inverter INV2 have in common. The other local interconnect 23b is coupled to the lead portion GM1 of the gate electrode G which the drain of the load MIS (Ld2), the source of the transfer MIS (Tr2), the load MIS (Ld1) and drive MIS (Dr1) making up the CMOS inverter INV1 have in common.

In the above-described step of forming the plug P1 in the contact holes C1 and first and second interconnect trenches HM1 and HM2, the tungsten film 22 is used as a main conductive material of the plug P1 and a film stack obtained by stacking the titanium nitride film 21c over the titanium films 21a and 21b is use as the barrier metal film 21, but they are not limited and can be modified in various ways. For example, it is possible to form the barrier metal film 21 as a film stack obtained by stacking the titanium nitride film 21c over the titanium nitride films 21a and 21b and use a copper film as the main conductive material of the plug. In this case, after formation of the barrier metal film 21 in a similar manner to that employed above, a seed layer, for example, a seed layer of copper or ruthenium is formed on the barrier metal film 21 by CVD or sputtering, and a copper plated film is formed on the seed layer by electroplating to fill the copper plated film in the contact holes C1 and first and second interconnect trenches HM1 and HM2.

The barrier metal film 21 and the seed layer are formed using the above-described film forming apparatus 50. As described above, the transfer chamber 51 of the film forming apparatus 50 is equipped with four chambers. When the tungsten film 22 is used as the main conductive material of the plug P1, a chamber (first chamber) 54 is used for dry cleaning treatment, a chamber (second chamber) 55 for heat treatment, and chambers (third chambers) 56 and 57 for the formation of a barrier metal film. When a copper film is used as the main conductive material of the plug P1, the chamber (first chamber) 54 is used for dry cleaning treatment, the chamber (second chamber) 55 for heat treatment, the chamber (third chambers) 56 for the formation of a barrier metal film, and the chamber (fourth chamber) 57 for the formation of a seed layer. Use of the apparatus having such a structure makes it possible to form a uniform seed layer, because the seed layer is continuously formed on the barrier metal film 21 whose surface is not exposed to the air and is therefore not contaminated. After formation of the seed layer, the copper film is filled in the contact holes C2 and first and second interconnect trenches HM1 and HM2 by the electroplating. Since the seed layer is formed uniformly, the copper film is filled in them almost completely, making it possible to attain smooth conduction of the plug P1.

Upper interconnects, for example, zero level, first level and second level interconnects are then formed. The formation steps of these interconnects will next be described.

Figure 25:
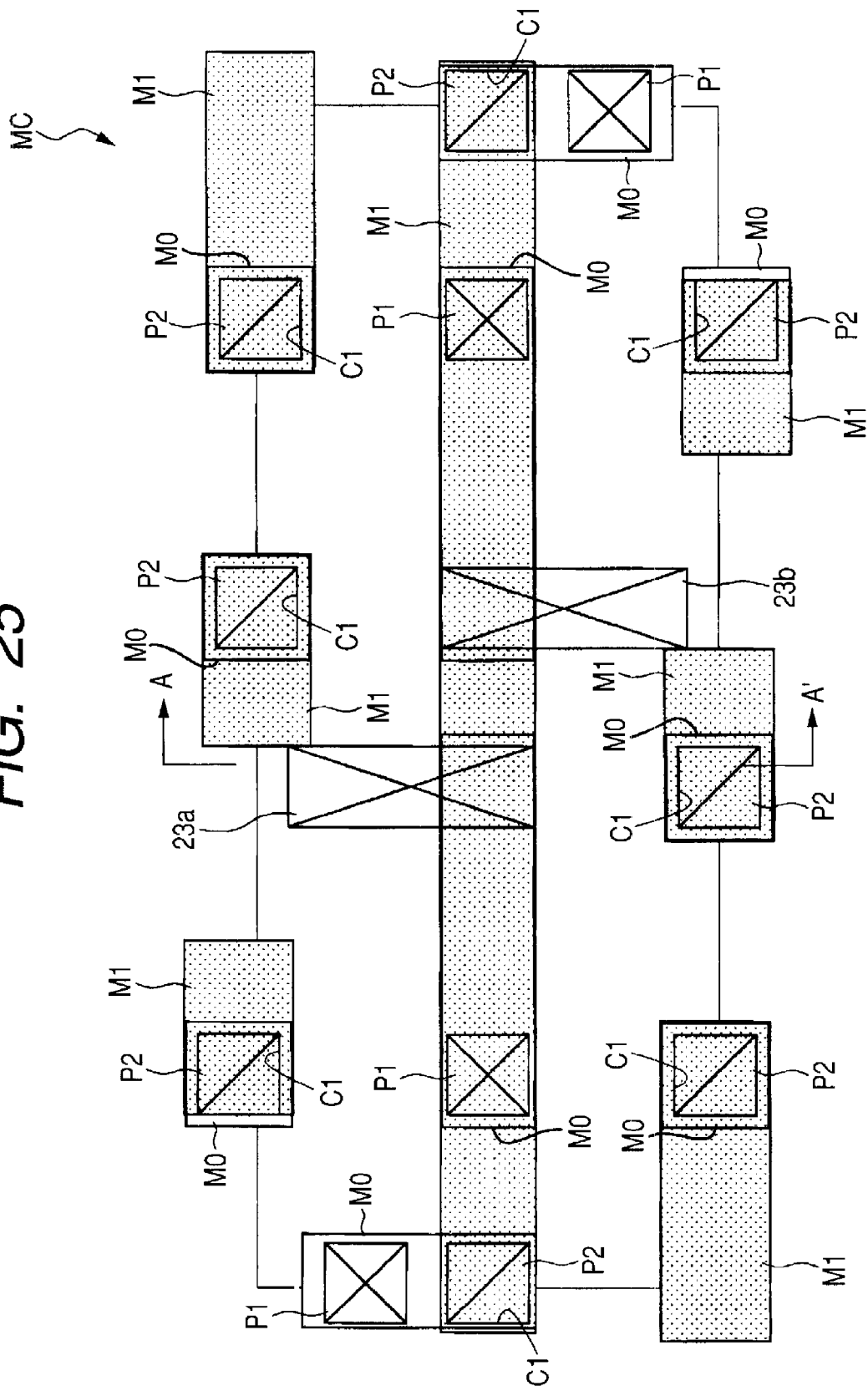
FIG. 25 is a fragmentary plan view illustrating the same portion as that illustrated in FIG. 2 in a manufacturing step following that of FIG. 24.
Figures 26A, 26B:
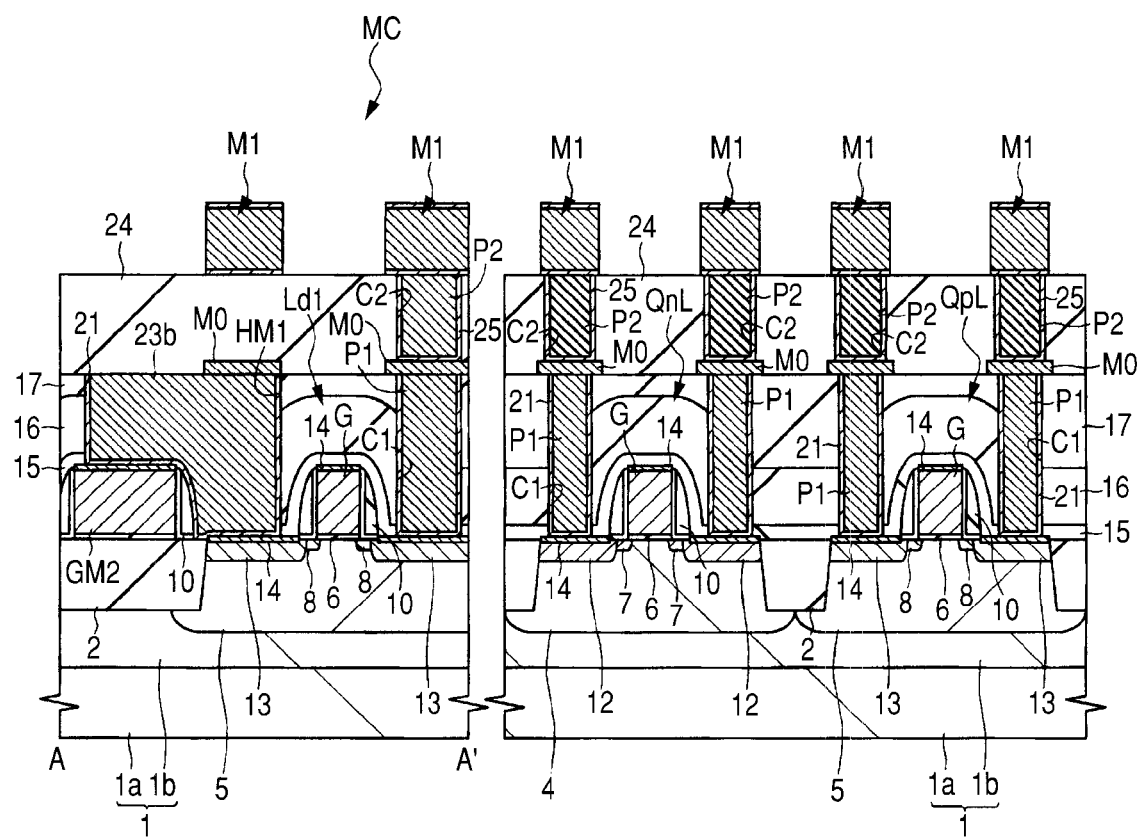
FIG. 26 is a fragmentary cross-sectional view illustrating the same portion as that illustrated in FIG. 3 in a manufacturing step following that of FIG. 24.

FIG. 25 is a fragmentary plan view illustrating the same portion as that illustrated in FIG. 2 in a manufacturing step following that of FIG. 24, FIG. 26(a) is a fragmentary cross-sectional view illustrating the same portion as that illustrated in FIG. 3(a) in the manufacturing step following that of FIG. 24, and FIG. 26(b) is a fragmentary cross-sectional view illustrating the same portion as that illustrated in FIG. 3(b) in the manufacturing step following that of FIG. 24.

A tungsten film having a thickness of, for example, about 0.1 μm is deposited over the local interconnects 23a and 23b and plug 1 by sputtering. The tungsten film is then patterned to form the zero-level interconnect M0.

A silicon oxide film 24 is then deposited over the local interconnects 23a and 23b, zero-level interconnect M0 and silicon oxide film 17 by CVD. The silicon oxide film 24 on the zero-level interconnect M0 is removed by etching to form contact holes C2.

A barrier metal film 25 is then formed on the silicon oxide film 24 including the insides of the contact holes C2. The barrier metal 25 is, for example, a film stack obtained by stacking a tantalum film over a titanium nitride film, tantalum nitride film and tantalum nitride film or a film stack obtained by stacking a ruthenium film over a tantalum nitride film. Prior to the formation of the barrier metal film 25, dry cleaning treatment as described above is performed. Also in the dry cleaning treatment here, the semiconductor wafer may be heated at a temperature from 100 to 150° C. and heating at a temperature higher than 150° C. to remove the product formed over the bottom surfaces and side walls of the contact holes C2. This makes it possible to reduce variations in the contact resistance between the barrier metal film 25 and the zero-level interconnect M0. It is also possible to prevent peeling of the barrier metal film 25 from the silicon oxide film 24.

A copper seed layer is formed on the barrier metal film 25 by CVD or sputtering, followed by formation of a copper plated film on the seed layer by electroplating. The copper plated film is filled in the contact hole C2. The copper plated film, seed layer and barrier metal film 25 in a region outside the contact holes C2 are then removed by CMP to form plugs P2 using the copper film as the main conductive film. In the plain view of FIG. 25, the gate electrode G and active region An1 are omitted from the illustration.

A first level interconnect (hatched in FIG. 25) M1 is then formed over the silicon oxide film 24 and plugs P2. First, a titanium film of about 0.01 μm thick and a titanium nitride film of about 0.05 μm thick are deposited successively by sputtering and then, the semiconductor substrate 1 is subjected to heat treatment at a temperature of, for example, from about 500 to 700° C. for about 1 minute. A tungsten film is then deposited by CVD, followed by patterning to form the first-level interconnects M1. Of the first-level interconnects M1, the first level interconnect M1 for coupling the gate electrodes G of the transfer MISs (Tr1 and Tr2) via the plugs P1 and P2 serves as a word line WL.

Figures 28A, 28B:
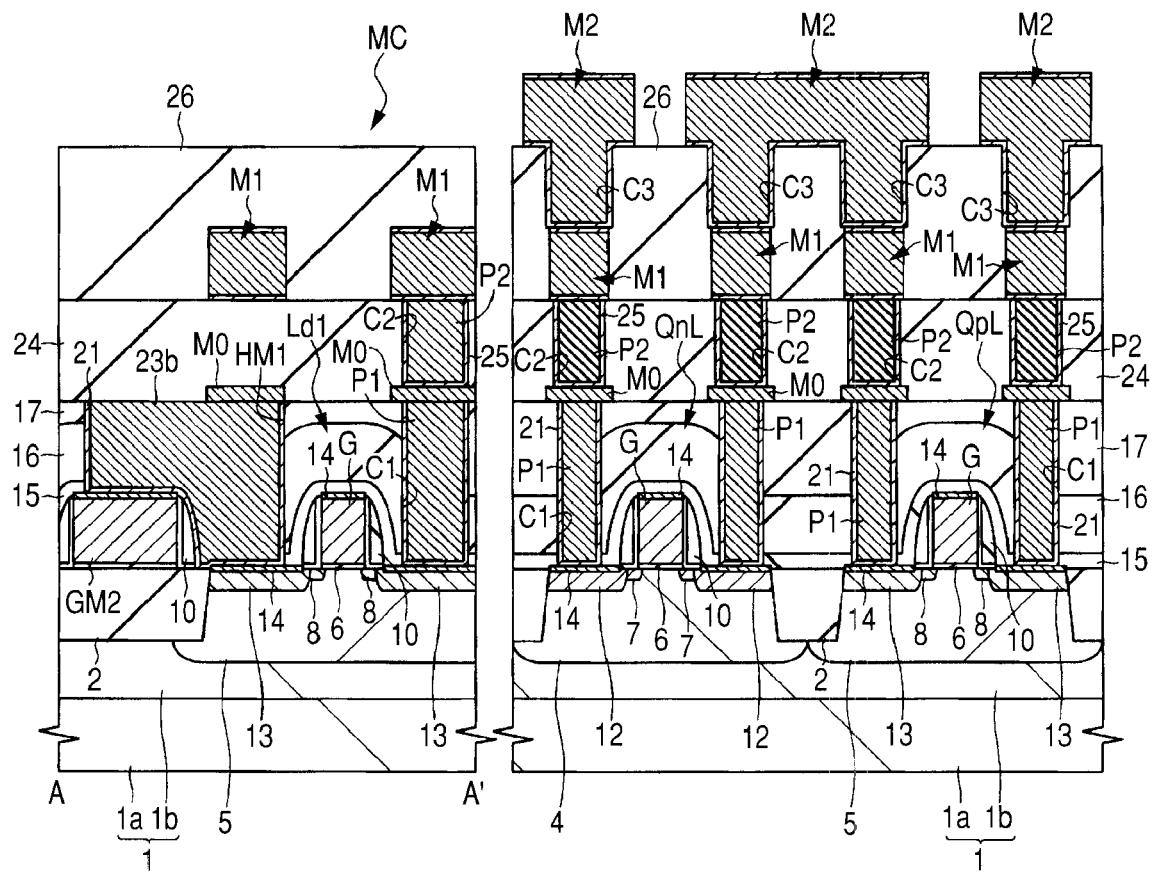
FIG. 28 is a fragmentary cross-sectional view illustrating the same portion as that illustrated in FIG. 3 in a manufacturing step following that of FIGS. 25 and 26.

FIG. 27 is a fragmentary plan view illustrating the same portion as that illustrated in FIG. 2 in a manufacturing step following that of FIGS. 25 and 26; FIG. 28(*a*) is a fragmentary cross-sectional view illustrating the same portion as that illustrated in FIG. 3(*a*) in the manufacturing step following that of FIGS. 25 and 26; and FIG. 28(*b*) is a fragmentary cross-sectional view illustrating the same portion as that illustrated in FIG. 3(*b*) in the manufacturing step following that of FIGS. 25 and 26.

After deposition of a silicon oxide film 26 on the first-level interconnect M1 and silicon oxide film 24 by CVD, the silicon oxide film 26 on the first-level interconnect M1 is etched off to form contact holes C3.

Next, second-level interconnects (hatched in FIG. 27) M2 are formed on the silicon oxide film 26. First, a titanium film of about 0.01 μm thick and a titanium nitride film of about 0.05 μm thick are deposited successively by sputtering and the semiconductor substrate 1 is heat treated at a temperature of, for example, from about 500 to 700° C. for about 1 minute. Then, a tungsten film is deposited by CVD and patterned to form the second-level interconnects M2. A reference potential Vss is supplied to the source of the drive MISs (Dr1 and Dr2) via the second-level interconnects M2. A supply potential Vcc is, on the other hand, supplied to the source of the load MISs (Ld1 and Ld2) via the second-level interconnect M2. The second-level interconnects M2 coupled to one ends of the drive MISs (Dr1 and Dr2) will be data lines DL and/DL, respectively.

According to the above process, the memory cell of SRAM and the peripheral circuit are almost completed.

According to the present embodiment, as described above, dry cleaning treatment is performed prior to the formation of the barrier metal film 21 inside the contact holes C1 and first and second interconnect trenches HM1 and HM2. A product a little different from its stoichiometric composition remains on the bottom surfaces and side surfaces of the contact holes C1 and first and second interconnect trenches HM1 and HM2, but it is removed by the heat treatment at a temperature higher than 150° C. which is performed after the dry cleaning treatment. It is therefore possible to reduce variations in the contact resistance between the nickel silicide layer 14 and barrier metal 21 on the bottom surfaces of the contact holes C1 and first and second interconnect trenches HM1 and HM2. It is also possible to prevent peeling of the barrier metal film 21 on the side surfaces of the contact holes C1 and first and second interconnect trenches HM1 and HM2.

Moreover, since the thermal reaction Ti film 21*a* having a low concentration of an impurity, for example, chlorine, can be formed as the bottom layer of the barrier metal film 21 to be contiguous to the nickel silicide layer 14 and the concentration of an impurity, for example, chlorine contained in the barrier metal film 21 can be decreased by plasma treatment using an $H_2$ gas, the barrier metal film 21 thus formed has low contact resistance with the nickel silicide layer 14 and is free of defects such as peeling and microcracks. In addition, it is possible to suppress or prevent diffusion of the constituent atoms of the plug by forming the nitrogen-rich TiN film 21*c* as the uppermost layer of the barrier metal film 21 to be contiguous to the plug.

Figure 29:
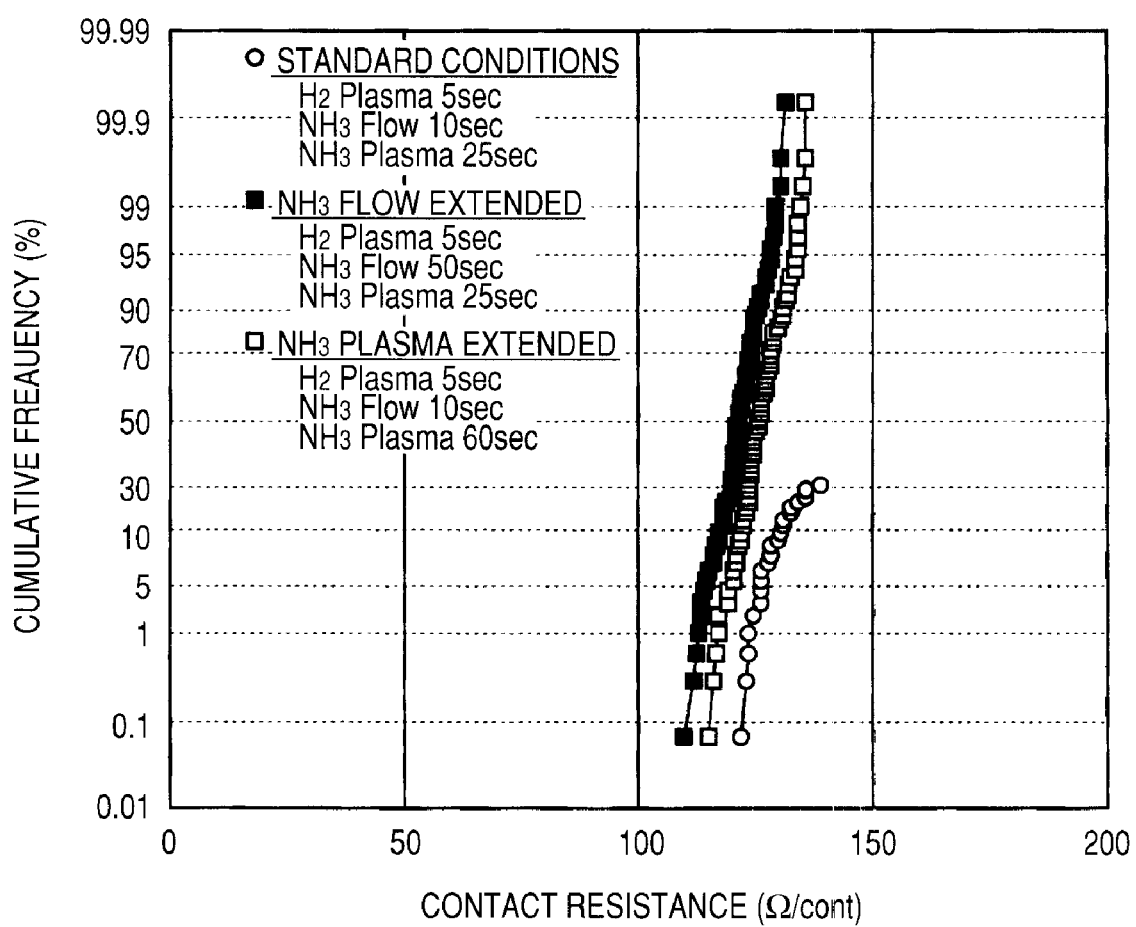
FIG. 29 is a graph showing the contact resistance between the plug and nickel silicide layer according to the one embodiment of the present invention.

Even if an oxide film grows on the surface of the nickel silicide layer 14 and remains unremoved by both the dry cleaning treatment and heat treatment, good conduction can be attained between the plug 1 and nickel silicide layer 14, because owing to the plasma treatment with an $H_2$ gas for from 5 to 30 seconds, thermal nitridation treatment of the surface of the plasma reaction Ti film 21*b* with an $NH_3$ gas for from 0 to 75 seconds, and plasma treatment with an $NH_3$ gas for from 25 to 75 seconds, atomic hydrogen passes through the plasma reaction Ti film 21*b* and reduces the oxide film which has remained between the plasma reaction Ti film 21*b* and nickel silicide layer 14 on the bottom surfaces of the first and second interconnect trenches HM1 and HM2. FIG. 29 shows the contact resistance between the plug and nickel silicide layer when the present invention is applied. The contact resistance is measured using a chain-structure pattern in which 7200 pairs of the nickel silicide layer and the plug filled in an interconnect trench with a long-side diameter of 200 nm and a short-side diameter of 90 nm have been chained. As illustrated in FIG. 29, the contact resistance between the plug and nickel silicide layer decreases by the thermal nitridation treatment with an $NH_3$ gas or plasma treatment with an $NH_3$ gas.

Moreover, the adhesion between the tungsten film 22 and nitrogen-rich TiN film 21*c* can be improved by forming, as one layer of the tungsten film 22 forming the plug and contiguous to the barrier metal film 21, the tungsten nucleation film 22*a* having a multilayer structure by $SiH_4$ reduction reaction or $B_2H_6$ reduction reaction. In addition, since the tungsten nucleation film 22*a* has a function of suppressing penetration of fluorine contained in a $WF_6$ gas and the tungsten film 22 can be formed at a relatively low temperature not greater than 400° C. by forming the blanket-tungsten film 22*b* by $H_2$ reduction, penetration, into the barrier metal film 21, of fluorine contained in a $WF_6$ gas can be suppressed or prevented and fluorine-induced corrosion of the barrier metal film 21 can be prevented.

When a plug made of copper as a conductive member to be filled in the contact holes C1 and first and second interconnect trenches HM1 and HM2 is used, the film forming apparatus 50 having a chamber for dry cleaning treatment (chamber 54), a chamber for heat treatment (chamber 55), a chamber for barrier metal film formation (chamber 56) and a chamber for seed layer formation (chamber 57) enables continuous formation of a seed layer on the barrier metal film 21 without exposing it to the air. The seed layer can therefore be formed uniformly and a copper film can be filled in the contact holes C1 and first and second interconnect trenches HM1 and HM2 almost completely by electroplating, resulting in good conduction of the plug.

Moreover, the film forming apparatus 50 can be equipped with two chambers 56 and 57 having the same function and same structure for the formation of a barrier metal film. Even if one of these two chambers, for example, the chamber 56 is stopped, a titanium film or titanium nitride film can be formed using, for example, the chamber 57 without stopping the film forming apparatus 50. This makes it possible to improve the operation ratio of the film forming apparatus 50.

The present invention made by the present inventors was described specifically based on its embodiment. It should however be borne in mind that the invention is not limited to or by the embodiment but can be changed without departing from the scope of the invention.

The present invention can be applied to the manufacture of a semiconductor device having a step of filling a metal film in a connecting hole opened in an insulating film.

What is claimed is:

1. A manufacturing method of a semiconductor device in which a first field effect transistor having a first gate electrode is electrically isolated by an element isolation from a second field effect transistor having a second gate electrode, and a lead portion of the second gate electrode extending over the element isolation is electrically coupled, via a conductive member, to a semiconductor region serving as a source or drain of the first field effect transistor, the method comprising the steps of:
   (a) forming, in a main surface of a semiconductor substrate, the element isolation, first and second active regions of the semiconductor substrate being electrically isolated by the element isolation;
   (b) forming the first gate electrode of the first field effect transistor in the first active region, forming the second gate electrode of the second field effect transistor in the second active region, and extending the lead portion of the second gate electrode over the element isolation;
   (c) after the step (b), forming a first insulating film over the main surface of the semiconductor substrate and anisotropically etching the first insulating film to form sidewalls made of the first insulating film over respective side walls of the first and second gate electrodes;
   (d) after the step (c), forming a silicide layer over surfaces of the first gate electrode and the semiconductor region serving as a source or drain of the first field effect transistor and over surfaces of the second gate electrode and a semiconductor region serving as a source or drain of the second field effect transistor;
   (e) after the step (d), depositing a second insulating film over the main surface of the semiconductor substrate;
   (f) forming an opening portion from which a portion of the silicide layer over the semiconductor region serving as the source or drain of the first field effect transistor, a portion of the silicide layer over the lead portion of the second gate electrode of the second field effect transistor, and a sidewall portion of the second field effect transistor are exposed, by etching the second insulating film in a region extending over both a portion of the semiconductor region serving as the source or drain of the first field effect transistor and a portion of the lead portion of the second gate electrode of the second field effect transistor;
   (g) forming a first metal film over a bottom portion of the opening portion by a thermal reaction using a first reaction gas;
   (h) forming, over the first metal film, a second metal film by a plasma reaction using the first reaction gas;
   (i) subjecting a surface of the second metal film to thermal nitridation with a third reaction gas containing nitrogen; and
   (j) subjecting the surface of the second metal film to a plasma treatment with the third reaction gas to form a first metal nitride film over the surface of the second metal film,
   wherein the thermal nitridation time in the step (i) is from 10 to 75 seconds, and
   wherein the plasma treatment time in the step (j) is from 25 to 75 seconds.

2. A manufacturing method of a semiconductor according to claim 1, wherein the first metal nitride film formed in the step (j) has a greater nitrogen content than that of the corresponding stoichiometric composition.

3. A manufacturing method of a semiconductor device according to claim 1, further comprising, between the step (h) and step (i), a step of:
   (k) subjecting the surface of the second metal film to a plasma treatment with a second reaction gas,
   wherein the plasma treatment time in the step (k) is from 5 to 30 seconds.

4. A manufacturing method of a semiconductor device according to claim 3, wherein the second reaction gas is an $H_2$ gas.

5. A manufacturing method of a semiconductor device according to claim 3, wherein the steps from (h) to (j) are repeated multiple times.

6. A manufacturing method of a semiconductor device according to claim 1, further comprising, after the step (j), a step of:
   (l) forming a second metal nitride film over the first metal nitride film by thermal CVD using a fourth reaction gas.

7. A manufacturing method of a semiconductor device according to claim 6, wherein the fourth reaction gas is a $TiCl_4$ gas and an $NH_3$ gas.

8. A manufacturing method of a semiconductor device according to claim 1, wherein the first reaction gas is a $TiCl_4$ gas.

9. A manufacturing method of a semiconductor device according to claim 1, wherein the third reaction gas is an $NH_3$ gas.

10. A manufacturing method of a semiconductor device according to claim 1, wherein the step (h) is repeated multiple times.

11. A manufacturing method of a semiconductor device according to claim 1, wherein the steps from (h) to (j) are repeated multiple times.

12. A manufacturing method of a semiconductor device according to claim 1, further comprising, between the step (f) and step (g), a step of:
   (m) dry cleaning the bottom portion of the opening portion with a seventh reaction gas.

13. A manufacturing method of a semiconductor device according to claim 12, wherein the seventh reaction gas contains at least one of an HF gas, an $NF_3$ gas, an $NH_3$ gas, and an $H_2$ gas.

14. A manufacturing method of a semiconductor device according to claim 12, further comprising, between the step (m) to step (g), a step of:
   (n) heat treating the semiconductor substrate.

15. A manufacturing method of a semiconductor device according to claim 1, wherein the bottom portion of the opening portion is open over a nickel silicide layer, a nickel alloy silicide layer, a cobalt silicide layer, a tungsten silicide layer, or a platinum silicide layer.

16. A manufacturing method of a semiconductor device in which a first field effect transistor having a first gate electrode is electrically isolated by an element isolation from a second field effect transistor having a second gate electrode, and a lead portion of the second gate electrode extending over the element isolation is electrically coupled, via a conductive member, to a semiconductor region serving as a source or drain of the first field effect transistor, the method comprising the steps of:

(a) forming, in a main surface of a semiconductor substrate, the element isolation, first and second active regions of the semiconductor substrate being electrically isolated by the element isolation;

(b) forming the first gate electrode of the first field effect transistor in the first active region, forming a second gate electrode of the second field effect transistor in the second active region, and extending the lead portion of the second gate electrode over the element isolation;

(c) after the step (b), forming a first insulating film over the main surface of the semiconductor substrate and anisotropically etching the first insulating film to form sidewalls made of the first insulating film over respective side walls of the first and second gate electrodes;

(d) after the step (c), forming a silicide layer over surfaces of the first gate electrode and the semiconductor region serving as a source or drain of the first field effect transistor and over surfaces of the second gate electrode and a semiconductor region serving as a source or drain of the second field effect transistor;

(e) after the step (d), depositing a second insulating film over the main surface of the semiconductor substrate;

(f) forming an opening portion from which a portion of the silicide layer over the semiconductor region serving as the source or drain of the first field effect transistor, a portion of the silicide layer over the lead portion of the second gate electrode of the second field effect transistor, and a sidewall portion of the second field effect transistor are exposed, by etching the second insulating film in a region extending over both a portion of the semiconductor region serving as the source or drain of the first field effect transistor and a portion of the lead portion of the second gate electrode of the second field effect transistor;

(g) placing the semiconductor substrate over a wafer stage of a first chamber of a film forming apparatus and dry cleaning a bottom portion of the opening portion with a seventh reaction gas supplied into the first chamber;

(h) placing the semiconductor substrate over a wafer stage of a second chamber of the film forming apparatus and thereafter heat treating the semiconductor substrate;

(i) placing the semiconductor substrate over a wafer stage of a third chamber of the film forming apparatus;

(j) forming a first metal film over the bottom portion of the opening portion by a thermal reaction using a first reaction gas;

(k) forming a second metal film over the first metal film by a plasma reaction using the first reaction gas;

(l) subjecting a surface of the second metal film to thermal nitridation with a third reaction gas containing nitrogen; and (m) subjecting the surface of the second metal film to a plasma treatment with the third reaction gas to form a first metal nitride film over the surface of the second metal film, wherein the step (j), the step (k), the step (l), and the step (m) are performed in the third chamber, wherein the thermal nitridation time in the step (i) is from 10 to 75 seconds, and wherein the plasma treatment time in the step (m) is from 25 to 75 seconds.

17. A manufacturing method of a semiconductor device according to claim 16, wherein the first metal nitride film formed in the step (m) has a greater nitrogen content than that of the corresponding stoichiometric composition.

18. A manufacturing method of a semiconductor device according to claim 16, further comprising, between the step (k) and step (l), a step of (n) subjecting the surface of the second metal film to a plasma treatment with a second reaction gas, wherein the plasma treatment time in the step (n) is from 5 to 30 seconds.

19. A manufacturing method of a semiconductor device according to claim 18, wherein the second reaction gas is an $H_2$ gas.

20. A manufacturing method of a semiconductor device according to claim 18, wherein the steps from (k) to (m) are repeated multiple times.

21. A manufacturing method of a semiconductor device according to claim 16, wherein the first reaction gas is a $TiCl_4$ gas.

22. A manufacturing method of a semiconductor device according to claim 16, wherein the third reaction gas is an $NH_3$ gas.

23. A manufacturing method of a semiconductor device according to claim 16, wherein the seventh reaction gas contains at least any one of an HF gas, an $NF_3$ gas, an $NH_3$ gas, and an $H_2$ gas.

24. A manufacturing method of a semiconductor device according to claim 16, wherein the step (k) is repeated multiple times.

25. A manufacturing method of a semiconductor device according to claim 16, wherein the steps from (k) to (m) are repeated multiple times.

26. A manufacturing method of a semiconductor device according to claim 16, wherein the bottom portion of the opening portion is open over a nickel silicide layer, a nickel alloy silicide layer, a cobalt silicide layer, a tungsten silicide layer, or a platinum silicide layer.

27. A manufacturing method of a semiconductor device in which a first field effect transistor having a first gate electrode is electrically isolated by an element isolation from a second field effect transistor having a second gate electrode, and a lead portion of the second gate electrode extending over the element isolation is electrically coupled, via a conductive member, to a semiconductor region serving as a source or drain of the first field effect transistor, the method comprising the steps of:

(a) forming, in a main surface of a semiconductor substrate, the element isolation, first and second active regions of the semiconductor substrate being electrically isolated by the element isolation;

(b) forming the first gate electrode of the first field effect transistor in the first active region, forming a second gate electrode of the second field effect transistor in the second active region, and extending the lead portion of the second gate electrode over the element isolation;

(c) after the step (b), forming a first insulating film over the main surface of the semiconductor substrate and anisotropically etching the first insulating film to form sidewalls made of the first insulating film over respective side walls of the first and second gate electrodes;

(d) after the step (c), forming a silicide layer over surfaces of the first gate electrode and the semiconductor region serving as a source or drain of the first field effect transistor and over surfaces of the second gate electrode and a semiconductor region serving as a source or drain of the second field effect transistor;

(e) after the step (d), depositing a second insulating film over the main surface of the semiconductor substrate;

(f) forming an opening portion from which a portion of the silicide layer over the semiconductor region serving as the source or drain of the first field effect transistor, a portion of the silicide layer over the lead portion of the second gate electrode of the second field effect transistor, and a sidewall portion of the second field effect transistor are exposed, by etching the second insulating film in a region extending over both a portion of the semiconductor region serving as the source or drain of the first field effect transistor and a portion of the lead portion of the second gate electrode of the second field effect transistor;

(g) forming a metal film over a bottom portion of the opening portion by a plasma reaction using a first reaction gas;

(h) subjecting a surface of the metal film to thermal nitridation with a third reaction gas containing nitrogen;

(i) subjecting the surface of the metal film to a plasma treatment with the third reaction gas to form a first metal nitride film over the surface of the metal film;

(j) forming a metal nucleation film over the first metal nitride film by CVD using a fifth reaction gas and a first reducing gas; and (k) forming a second metal film over the metal nucleation film by CVD using a sixth reaction gas and a second reducing gas, wherein the thermal nitridation time in the step (h) is from 10 to 75 seconds, and wherein the plasma treatment time in the step (i) is from 25 to 75 seconds.

28. A manufacturing method of a semiconductor device according to claim 27, wherein the step (j) comprises repetition, plural times, of formation of the metal nucleation film over the first metal nitride film by CVD with the fifth reaction gas and reduction of the metal nucleation film with the first reducing gas.

29. A manufacturing method of a semiconductor device according to claim 27, wherein the temperature of the semiconductor substrate in the step (k) is 400° C. or less.

30. A manufacturing method of a semiconductor device according to claim 27, wherein the fifth reaction gas is a $WF_6$ gas, while the first reducing gas is a gas containing an $SiH_4$ gas.

31. A manufacturing method of a semiconductor device according to claim 27, wherein the fifth reaction gas is a $WF_6$ gas, while the first reducing gas is a gas containing a $B_2H_6$ gas.

32. A manufacturing method of a semiconductor device according to claim 31, wherein the metal nucleation film has an amorphous structure.

33. A manufacturing method of a semiconductor device according to claim 27, wherein the sixth reaction gas is a $WF_6$ gas, while the second reducing gas is an $H_2$ gas.

34. A manufacturing method of a semiconductor device according to claim 27, wherein the metal nucleation film has a thickness of 0.01 μm or less.

35. A manufacturing method of a semiconductor device according to claim 27, wherein the first metal nitride film formed in the step (i) has a greater nitrogen content than that of the corresponding stoichiometric composition.

36. A manufacturing method of a semiconductor device according to claim 27, further comprising, between the step (g) and step (h), a step of (l) subjecting the surface of the second metal film to a plasma treatment with a second reaction gas, wherein the plasma treatment time in the step (l) is from 5 to 30 seconds.

37. A manufacturing method of a semiconductor device according to claim 36, wherein the second reaction gas is an $H_2$ gas.

38. A manufacturing method of a semiconductor device according to claim 27, further comprising, between the step (i) and step (j), a step of:

(m) forming a second metal nitride film over the first metal nitride film by thermal CVD using a fourth reaction gas.

39. A manufacturing method of a semiconductor device according to claim 38, wherein the fourth reaction gas is a $TiCl_4$ gas and an $NH_3$ gas.

40. A manufacturing method of a semiconductor device according to claim 27, wherein the first reaction gas is a $TiCl_4$ gas.

41. A manufacturing method of a semiconductor device according to claim 27, wherein the third reaction gas is an $NH_3$ gas.

* * * * *